US006762465B2

(12) United States Patent
Ebina

(10) Patent No.: US 6,762,465 B2
(45) Date of Patent: Jul. 13, 2004

(54) BICMOS INVERTER

(75) Inventor: Akihiko Ebina, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/050,793

(22) Filed: Jan. 18, 2002

(65) Prior Publication Data

US 2002/0113266 A1 Aug. 22, 2002

(30) Foreign Application Priority Data

Jan. 19, 2001 (JP) ........................................ 2001-011859

(51) Int. Cl.⁷ .......................... H01L 29/70; H01L 29/68
(52) U.S. Cl. ....................... 257/378; 257/369; 257/370; 326/110; 327/112
(58) Field of Search ................................ 257/350, 370, 257/378, 296, 335, 344, 347, 355, 369, 510, 531, 565, 592, 758, 250, 351, 270; 326/84, 109, 110; 327/112, 432

(56) References Cited

U.S. PATENT DOCUMENTS

| | | | |
|---|---|---|---|
| 5,126,595 A | * | 6/1992 | Hara et al. ................... 326/110 |
| 5,240,865 A | | 8/1993 | Malhi |
| 5,459,083 A | | 10/1995 | Subrahmanyan et al. |
| 5,552,624 A | | 9/1996 | Skotnicki et al. |
| 5,998,854 A | | 12/1999 | Morishita et al. |
| 6,137,146 A | * | 10/2000 | Manning ..................... 257/378 |
| 6,225,664 B1 | | 5/2001 | Endo et al. |
| 6,232,649 B1 | | 5/2001 | Lee |
| 6,246,104 B1 | | 6/2001 | Tsuda et al. |
| 6,268,630 B1 | * | 7/2001 | Schwank et al. ........... 257/347 |
| 2002/0130409 A1 | | 9/2002 | Oue et al. |

FOREIGN PATENT DOCUMENTS

| | | |
|---|---|---|
| JP | 62-128561 | 6/1987 |
| JP | 05-041488 | 2/1993 |
| JP | 05-218316 | 8/1993 |
| JP | 11-204801 | 7/1999 |
| JP | 2001-007332 | 1/2001 |
| JP | 2001-007333 | 1/2001 |

OTHER PUBLICATIONS

Silicon Processing for the VLSI Era, Wolf. Stanley. Lattice Press. 1990. vol. II. pp. 557–558.*
SOI bipolar–MOS merged transistors for BiCMOS application: Zheng et al.. Electronics Letters, vol. 35 Issue 14. Jul. 8, 1999 pp. 1203–1204.*
U.S. application Ser. No. 10/050,792, filed Jan.18, 2002, having U.S. patent application Pub. No. U.S. 2002/0153575 A1, published Oct. 24, 2002.
U.S. application Ser. No. 10/014,612, filed Dec. 14, 2001, having U.S. patent application Pub. No. U.S. 2002/0117721 A, published Aug. 29, 2002.
Notice of Reasons of Rejection for Japanese Patent Application No. 2001–011859 (from which priority is claimed in U.S. Ser. No. 10/050,793), which cites JP05–041488 and JP05–218316.

(List continued on next page.)

Primary Examiner—Minhloan Tran
Assistant Examiner—Thomas L Dickey
(74) Attorney, Agent, or Firm—Konrad Raynes & Victor, LLP; Alan S. Raynes

(57) ABSTRACT

A semiconductor device 1000 may include first and second switch elements 1000A and 1000B formed in first and second element forming regions 16a and 16b of a SOI layer 10a, respectively. The first and second switch elements 1000A and 1000B form a BiCMOS inverter circuit, and each includes a field effect transistor and a bi-polar transistor. A first p-type body region 50a is electrically connected to an n-type source region 120. The first p-type body region 50a is electrically connected to a first p-type base region 220. A second n-type body region 54a is electrically connected to a second n-type collector region 430. A p-type drain region 330 is electrically connected to a second p-type base region 420.

15 Claims, 25 Drawing Sheets

OTHER PUBLICATIONS

Notice of Reasons of Rejection for Japanese Patent Application No. 2001–011858 (from which priority is claimed in U.S. Ser. No. 10/050,792), which cites JP05–041488 and JP05–218316, which were previously cited in an IDS.

Notice of Reasons of Rejection for Japanese Patent Application No. 2000–382395 (from which priority is claimed in U.S. Ser. No. 10/014,612), which cites JP05–041488 and JP05–218316, which were previously cited in an IDS.

Parke et al., "Bipolar–FET Hybrid–Mode Operation of Quarter–Micrometer SOI MOSFET's," *IEEE Electron Device Letters*, vol. 14, No. 5, May 1993, pp. 234–236.

* cited by examiner

BICMOS INVERTER

Applicant hereby incorporates by reference U.S. patent application Ser. No. 10/050,792, filled Jan. 18, 2002, in its entirety.

TECHNICAL FIELD

The present invention includes semiconductor devices including a plurality of switch elements each having a field effect transistor and a bi-polar transistor, and methods for manufacturing the same.

RELATED ART

A MOS field effect transistor with an SOI structure can be driven at a low power consumption and at a higher speed compared to an ordinary MOS field effect transistor.

FIG. 26 schematically shows one example of a MOS field effect transistor with an SOI structure. An embedded oxide film 1100 that is formed from a silicon oxide film is formed on a silicon substrate 2000. A source region 1200 and a drain region 1300 are formed on the embedded oxide film 1100. A body region 1400 is formed on the embedded oxide film 1100 and between the source region 1200 and the drain region 1300. A gate electrode 1500 is formed on the body region 1400 through a gate dielectric layer.

It is noted that the body region 1400 of the MOS field effect transistor is in a floating state. Accordingly, carriers that are generated by an impact ionization phenomenon are stored in the body region 1400. When carriers are stored in the body region 1400, the potential of the body region 1400 changes. A phenomenon that is a so-called substrate floating effect takes place. When the substrate floating effect occurs, a kink phenomenon and a history effect occur in the MOS field effect transistor.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 1:
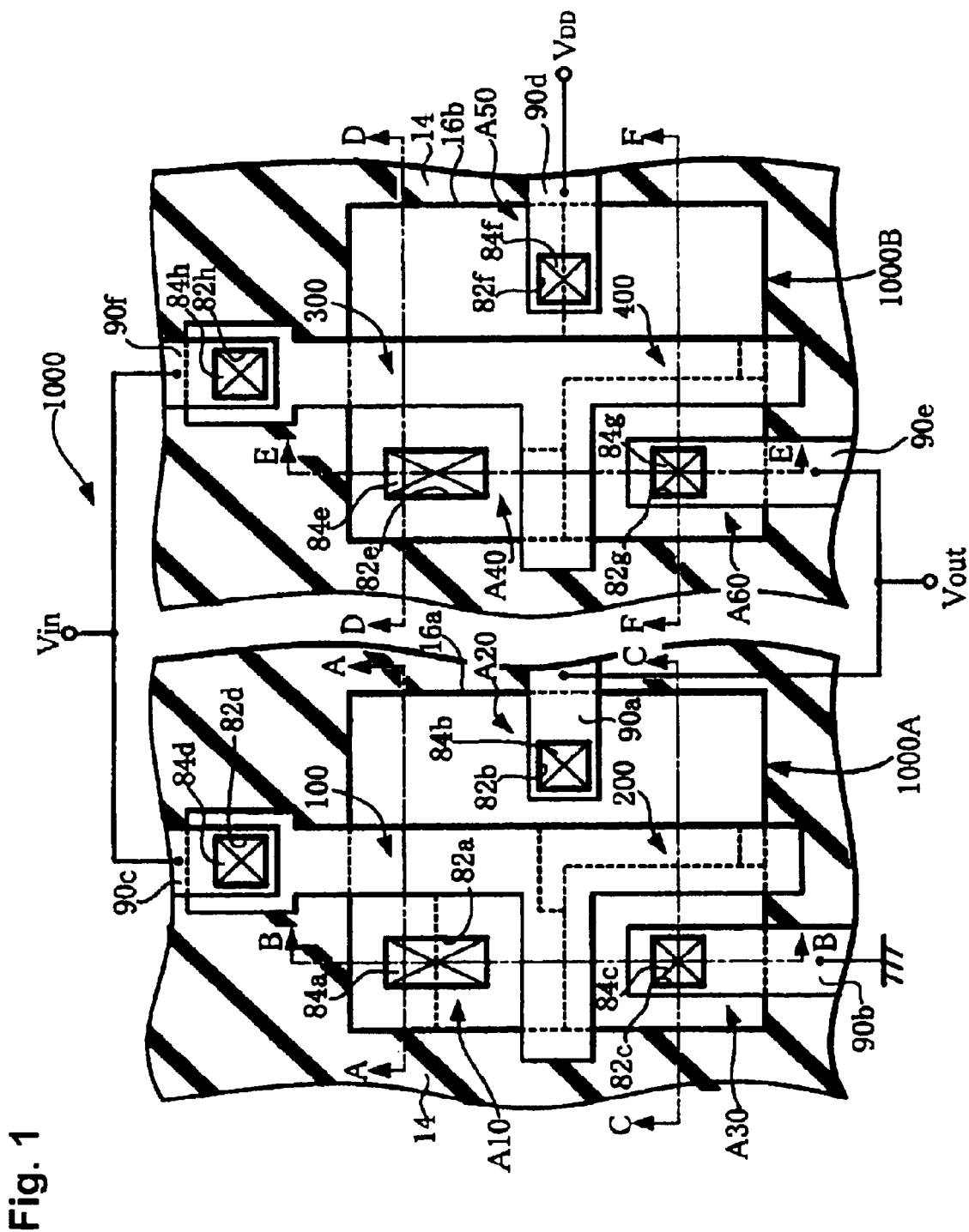
FIG. 1 schematically shows a plan view of a semiconductor device in accordance with an embodiment of the present invention.

Certain embodiments of the present invention provide a semiconductor device including switch elements, which suppresses the substrate floating effect and a method for manufacturing the same.

A first semiconductor device in accordance with certain embodiments of the present invention comprises:

an insulation layer;

a semiconductor layer formed on the insulation layer;

an element isolation region formed in the semiconductor layer; and a first element forming region and a second element forming region defined by the element isolation region;

wherein the first element forming region includes both a first bi-polar transistor and a first field effect transistor;

the first bi-polar transistor includes a first emitter region of a first conduction type, a first base region of a second conduction type, and a first collector region of the first conduction type, the first field effect transistor includes a first gate electrode layer, a source region of the first conduction type, and a drain region of the first conduction type, the first field effect transistor further includes a first body region of the second conduction type formed at least between the source region of the first conduction type and the drain region of the first conduction type, the first body region of the second conduction type is electrically connected to the source region of the first conduction type, the first body region of the second conduction type is electrically connected to the first base region of the second conduction type, the drain region of the first conduction type is electrically connected to the first collector region of the first conduction type, and the source region of the first conduction type is formed structurally isolated from the first emitter region of the first conduction type, and wherein the second element forming region includes both a second bi-polar transistor and a second field effect transistor, the second bi-polar transistor includes a second emitter region of the first conduction type, a second base region of the second conduction type, and a second collector region of the first conduction type, the second field effect transistor includes a second gate electrode layer, a source region of the second conduction type, and a drain region of the second conduction type, the second field effect transistor further including a first body region of the first conduction type formed at least between the source region of the second conduction type and the drain region of the second conduction type, the first body region of the first conduction type is electrically connected to the second collector region of the first conduction type, the source region of the second conduction type is electrically connected to the second collector region of the first conduction type, the drain region of the second conduction type is electrically connected to the second base region of the second conduction type, the first collector region of the first conduction type is electrically connected to the second emitter region of the first conduction type, and the first gate electrode layer is electrically connected to the second gate electrode layer.

In accordance with certain embodiments, the above-described semiconductor device may provide, for example, the following effects.

A switch element including a first bi-polar transistor and a first field effect transistor formed in a first element forming region (hereafter referred to as a "first switch element") can prevent the substrate floating effect from occurring. In other words, changes in the threshold voltage, and occurrence of kink and history effects can be suppressed.

A switch element including a second bi-polar transistor and a second field effect transistor formed in a second element forming region (hereafter referred to as a "second switch element") can prevent the substrate floating effect from occurring. In other words, changes in the threshold voltage, and occurrence of kink and history effects can be suppressed.

The first collector region of the first conduction type and the second emitter region of the first conduction type are electrically connected to one another, and the first gate electrode layer and the second gate electrode layer are electrically connected to one another, such that the first switch element and the second switch element form a BiCMOS inverter circuit. Since the BiCMOS inverter circuit is formed from the first and second switch elements in which the substrate floating effect is suppressed, its characteristics can be improved.

The first semiconductor device described above may also include at least one of the following embodiments.

(1) An embodiment may further comprise:

a first electrode layer that continues to a side section of the first gate electrode layer and reaches the element isolation region, wherein the first gate electrode layer is formed in a manner to cross over the element forming region, the source region of the first conduction type is formed in a first region surrounded by the first gate electrode layer in a forming region of the first field effect transistor, the first electrode layer, and the element isolation region, the drain region of the first conduction type and the collector region of the first conduction type are formed in a second region surrounded by the first gate electrode layer and the element isolation region, the emitter region of the first conduction type is formed in a third region surrounded by the first gate electrode layer in a forming region of the first bi-polar transistor, the first electrode layer and the element isolation region, and the first body region of the second conduction type is formed at least below the first gate electrode layer in the forming region of the first field effect transistor, and below a part of the first electrode layer.

(2) An embodiment may also further comprise:

a second electrode layer having one end section that continues to a side section of the second gate electrode layer and another end section that reaches the element isolation region, wherein the second gate electrode layer is formed in a manner to cross over the second element forming region, the drain region of the second conduction type is formed in a fourth region surrounded by the second gate electrode layer in the forming region of the second field effect transistor, the second electrode layer, and the element isolation region, the source region of the second conduction type and the collector region of the first conduction type are formed in a fifth region surrounded by the second gate electrode layer and the element isolation region, the emitter region of the first conduction type is formed in a sixth region surrounded by the second gate electrode layer in the forming region of the second bi-polar transistor, the second electrode layer and the element isolation region, and the first body region of the first conduction type is formed below the second gate electrode layer.

Alternatively, the first semiconductor device described above may also include at least one of the following embodiments.

(1) An embodiment may further comprise:

a first layer and a second layer, wherein
the first layer has one end section continuing to the first gate electrode layer or the second layer, and another end section reaching the element isolation region,
the second layer has one end section continuing to the first gate electrode layer or the second layer, and another end section reaching the element isolation region,
the source region of the first conduction type is formed in a first region surrounded by the first gate electrode layer, the first layer and the element isolation region,
the drain region of the first conduction type and the first collector region of the first conduction type are formed in a second region surrounded by the first gate electrode layer, the second layer and the element isolation region.
the first emitter region of the first conduction type is formed in a third region surrounded by the first layer, the second layer and the element isolation region,
the first base region of the second conduction type is formed below a part of the first layer, and below a part of the second layer in the semiconductor layer, and
the first body region of the second conduction type is formed at least below the first gate electrode layer and below a part of the first layer in the semiconductor layer.

(2) An embodiment may further comprise:

a third layer and a fourth layer, wherein
the third layer has one end section continuing to the second gate electrode layer or the fourth layer, and another end section reaching the element isolation region,
the fourth layer has one end section continuing to the second gate electrode layer or the third layer, and another end section reaching the element isolation region,
the drain region of the second conduction type is formed in a fourth region surrounded by the second gate electrode layer, the third layer and the element isolation region,
the source region of the second conduction type and the second collector region of the first conduction type are formed in a fifth region surrounded by the second gate electrode layer, the fourth layer and the element isolation region,
the second emitter region of the first conduction type is formed in a sixth region surrounded by the third layer, the fourth layer and the element isolation region,
the second base region of the second conduction type is formed below a part of the third layer, and below a part of the fourth layer in the semiconductor layer, and
the first body region of the first conduction type is formed at least below the second gate electrode layer and below a part of the fourth layer in the semiconductor layer, and
a second body region of the second conduction type is provided in the semiconductor layer below a part of the third layer for electrically connecting the second body region of the second conduction type and the drain region of the second conduction type.

Also, the first semiconductor device described above may also include at least one of the following embodiments.

(1) An embodiment may further comprise, in the first element forming region, a second body region of the first conduction type, which is formed in the semiconductor layer between the first base region of the second conduction type and the first collector region of the first conduction type.

(2) An embodiment may be provided with an impurity diffusion layer of the second conduction type that is further formed in the first element forming region,
wherein the impurity diffusion layer of the second conduction type is a semiconductor layer in the first region, and is formed in the semiconductor layer between the source region of the first conduction type and the first body region of the second conduction type, and
the source region of the first conduction type and the first body region of the second conduction type are electrically connected to one another through the impurity diffusion layer of the second conduction type.

(3) An embodiment may be provided with a contact layer for electrically connecting the impurity diffusion layer of the second conduction type and the source region of the first conduction type, wherein the contact layer is formed in a manner to cross over the impurity diffusion layer of the second conduction type and the source region of the first conduction type.

(4) An embodiment may be provided with a third body region of the second conduction type that is formed in the semiconductor layer between the first collector region of the first conduction type and the first emitter region of the first conduction type and in the semiconductor layer adjacent to the element isolation region.

(5) An embodiment may be provided with a contact layer for electrically connecting the source region of the second conduction type and the second contact region of the first conduction type, which is formed in the second element isolation region, wherein
the contact layer is formed in a manner to cross over the source region of the second conduction type and the second collector region of the first conduction type.

(6) An embodiment may be provided with a fourth body region of the second conduction type that is formed in the semiconductor layer between the second collector region of the first conduction type and the second emitter region of the first conduction type, and in the semiconductor layer adjacent to the element isolation region.

(7) An embodiment may be provided wherein the first conduction type is n-type, and the second conduction type is p-type. Alternatively, an embodiment may be provided wherein the first conduction type is p-type, and the second conduction type is n-type.

(8) An embodiment may be provided wherein the semiconductor layer is a silicon layer.

A second semiconductor device in accordance with certain embodiments of the present invention comprises:

an insulation layer;
a semiconductor layer formed on the insulation layer;
an element isolation region formed in the semiconductor layer; and
a first element forming region and a second element forming region defined by the element isolation region,
wherein the first element forming region includes both a first bi-polar transistor and a first field effect transistor,
a first gate electrode layer is formed on the semiconductor layer, the first gate electrode layer is formed in a manner to cross over the first element forming region, a first electrode layer is formed on the semiconductor layer, the first electrode layer has one end section continuing to a side section of the first gate electrode layer, and another end section reaching the element isolation region, a first impurity diffusion layer of a first conduction type is formed at least in a part of a first region surrounded by the first gate electrode layer in a forming region of the first field effect transistor, the first electrode layer and the element isolation region, a second impurity diffusion layer of the first conduction type is formed in a second region surrounded by the first gate electrode layer and the element isolation region, a third impurity diffusion layer of the first conduction type is formed in a third region defined by the first gate electrode layer in a forming region of the first bi-polar transistor, the first electrode layer and the element isolation region, a first body region of a second conduction type is formed below the first gate electrode layer in a forming region of the first field effect transistor and the first electrode layer, a first impurity diffusion layer of the second conduction type is formed below the first gate electrode layer in the forming region of the first bi-polar transistor and the first electrode layer and along a periphery of the third impurity diffusion layer of the first conduction type, the first body region of the second conduction type is electrically connected to the first impurity diffusion layer of the first conduction type, and the first body region of the second conduction type is electrically connected to the first impurity diffusion layer of the second conduction type, and wherein the second element forming region includes both a second bi-polar transistor and a second field effect transistor, a second gate electrode layer is formed on the semiconductor layer, the second gate electrode layer is formed in a manner to cross over the second element forming region, a second electrode layer is formed on the semiconductor layer, the second electrode layer has one end section continuing to a side section of the second gate electrode layer, and another end section reaching the element isolation region, a second impurity diffusion layer of the second conduction type is formed in a fourth region surrounded by the second gate electrode layer in a forming region of the second field effect transistor, the first electrode layer and the element isolation region, a third impurity diffusion layer of the second conduction type is formed in a fifth region surrounded by the second gate electrode layer and the element isolation region and in the forming region of the second field effect transistor, a fourth impurity diffusion layer of the first conduction type is formed in a fifth region in a forming region of the second bi-polar transistor, a fifth impurity diffusion layer of the first conduction type is formed in a sixth region surrounded by the second gate electrode layer in the forming region of the second bi-polar transistor and the element isolation region, a body region of the first conduction type is formed below the second gate electrode layer, a fourth impurity diffusion layer of the second conduction type is formed below the second gate electrode layer in the forming region of the second bi-polar transistor and the second electrode layer and along a periphery of the fifth impurity diffusion layer of the first conduction type, the body region of the first conduction type is electrically connected to the fourth impurity diffusion layer of the first conduction type, the third impurity diffusion layer of the second conduction type is electrically connected to the fourth impurity diffusion layer of the first conduction type, the second impurity diffusion layer of the second conduction type is electrically connected to the fourth impurity diffusion layer of the second conduction type, the second impurity diffusion layer of the first conduction type is electrically connected to the fifth impurity diffusion layer of the first conduction type, and the first gate electrode layer is electrically connected to the second gate electrode layer.

A first method for manufacturing a semiconductor device in accordance with certain embodiments of the present invention pertains to a method for manufacturing a semiconductor device including an insulation layer and a semiconductor layer formed on the insulation layer, the method comprising the steps of:

(A) forming an element isolation region in the semiconductor layer to define a first element forming region and a second element forming region; and (B) forming a first field effect transistor and a first bi-polar transistor in the first element forming region, wherein the step (B) comprises the steps of:

(B-1) forming a first body region of a second conduction type in the semiconductor layer at least in a forming region where a first gate electrode layer is to be formed, (B-2) forming a first gate electrode layer and a first electrode layer on the semiconductor layer in the first element forming region, wherein the first electrode layer continues to the first gate electrode layer and reaches the element isolation region, (B-3) forming a first impurity diffusion layer of the second conduction type in the semiconductor layer in a third region surrounded by the first gate electrode layer in a forming region of the bi-polar transistor, the first electrode layer and the element isolation region, (B-4) conducting a thermal treatment to thermally diffuse the first impurity diffusion layer of the second conduction type to form a first base region of the second conduction type of the first bi-polar transistor below a part of the first gate electrode layer and in the semiconductor layer below the first electrode layer, and to electrically connect the first base region of the second conduction type and the first body region of the second conduction type, (B-5) forming a source region of a first conduction type of the first field effect transistor at least in a part of a first region surrounded by a first gate electrode layer in a forming region of the first field effect transistor, the first electrode layer and the element isolation region, (B-6) forming a drain region of the first conduction type of the first field effect transistor in a part of a second region surrounded by the first gate electrode layer and the element isolation region,
(B-7) forming a first collector region of the first conduction type of the first bi-polar transistor in a part of the second region,
(B-8) forming a first emitter region of the first conduction type of the first bi-polar transistor in the third region, and
(B-9) electrically connecting the first body region of the second conduction type and the source region of the first conduction type:
the step (C) of forming a second field effect transistor and a second bi-polar transistor in the second element forming region,
wherein the step (C) comprises the steps of:
(C-1) forming a first body region of the first conduction type in the semiconductor layer at least in a forming region where a second gate electrode layer is to be formed,
(C-2) forming a second body region of the second conduction type at least in a part of the semiconductor layer in a forming region where a second electrode layer is to be formed,
(C-3) forming a second gate electrode layer and a second electrode layer on the semiconductor layer in the second element forming region, wherein the second electrode layer has one end section continuing to a side section of the gate electrode layer and another end section reaching the element isolation region,
(C-4) forming a second impurity diffusion layer of the second conduction type in the semiconductor layer in a sixth region surrounded by the second gate electrode layer in a forming region of the second bi-polar transistor, the second electrode layer and the element isolation region,
(C-5) conducting a thermal treatment to thermally diffuse the second impurity diffusion layer of the second conduction type to form a second base region of the second conduction type of the second bi-polar transistor below a part of the second gate electrode layer and in the semiconductor layer below the second electrode layer, and to electrically connect the second base region of the second conduction type and the second body region of the second conduction type,
(C-6) forming a drain region of the second conduction type of the second field effect transistor in a fourth region surrounded by a second gate electrode layer in a forming region of the second field effect transistor, the second electrode layer and the element isolation region,
and electrically connecting the drain region of the second conduction type to the second base region of the second conduction type through the second body region of the second conduction type,
(C-7) forming a source region of the second conduction type of the second field effect transistor in a part of a fifth region surrounded by the second gate electrode layer and the element isolation region,
(C-8) forming a second collector region of the first conduction type of the second bi-polar transistor in a part of the fifth region,
and electrically connecting the second collector region of the first conduction type and the first body region of the first conduction type,
(C-9) forming a second emitter region of the first conduction type of the second bi-polar transistor in the sixth region, and
(C-10) electrically connecting the source region of the second conduction type and the second collector region of the first conduction type;
the step (D) of electrically connecting the first collector region of the first conduction type and the second emitter region of the first conduction type; and
the step (E) of electrically connecting the first gate electrode layer and the second gate electrode layer.
A second method for manufacturing a semiconductor device in accordance with certain embodiments of the present invention pertains to a method for manufacturing a semiconductor device including an insulation layer and a semiconductor layer formed on the insulation layer, the method comprising the steps of:
(A) forming element isolation regions in the semiconductor layer to define a first element forming region and a second element forming region; and
(B) forming a first field effect transistor and a first bi-polar transistor in the first element forming region,
wherein the step (B) comprises the steps of:
(B-1) forming a first body region of a second conduction type in the semiconductor layer at least in a forming region where a first gate electrode layer is to be formed and in a forming region where a first layer is to be formed,
(B-2) forming a first gate electrode layer on the semiconductor layer in the first element forming region,
(B-3) forming a first layer on the semiconductor layer in the first element forming region,
the first layer having one end section continuing to the first gate electrode layer or a second layer, and another end section reaching the element isolation region,
(B-4) forming a second layer on the semiconductor layer in the first element forming region,
the second layer having one end section continuing to the first gate electrode layer or the first layer, and another end section reaching the element isolation region,
(B-5) forming a first impurity diffusion layer of the second conduction type in the semiconductor layer in a third region surrounded by the first layer, the second layer and the element isolation region,
(B-6) conducting a thermal treatment to thermally diffuse the first impurity diffusion layer of the second conduction type to form a first base region of the second conduction type of the first bi-polar transistor below a part of the first layer and in the semiconductor layer below a part of the second layer, and to electrically connect the first base region of the second conduction type and the first body region of the second conduction type,
(B-7) forming a source region of a first conduction type of the first field effect transistor at least in a part of a first region surrounded by the gate electrode layer, the first layer and the element isolation region,
(B-8) forming a drain region of the first conduction type of the first field effect transistor in a part of a second region surrounded by the gate electrode layer, the second layer and the element isolation region,
(B-9) forming a first collector region of the first conduction type of the first bi-polar transistor in a part of a second region surrounded by the first gate electrode layer, the second layer and the element isolation region, (B-10) forming a first emitter region of the first conduction type of the first bi-polar transistor in a third region surrounded by the first layer, the second layer and the element isolation region, and (B-11) electrically connecting the first body region of the second conduction type and the source region of the first conduction type;

the step (C) of forming a second field effect transistor and a second bi-polar transistor in the second element forming region, wherein the step (C) comprises the steps of:

(C-1) forming a first body region of a first conduction type in the semiconductor layer at least in a forming region where a second gate electrode layer is to be formed and a forming region where a fourth layer is to be formed, (C-2) forming a second body region of the second conduction type at least in a part of the semiconductor layer in a forming region where a third layer is to be formed, (C-3) forming a second gate electrode layer on the semiconductor layer in the second element forming region, (C-4) forming a third layer on the semiconductor layer in the second element forming region, wherein the third layer has one end section continuing to the second gate electrode layer or the fourth layer, and another end section reaching the element isolation region, (C-5) forming a fourth layer on the semiconductor layer in the second element forming region, wherein the fourth layer has one end section continuing to the second gate electrode layer or the third layer, and another end section reaching the element isolation region, (C-6) forming a second impurity diffusion layer of the second conduction type in the semiconductor layer in a sixth region surrounded by the third layer, the fourth layer and the element isolation region, (C-7) conducting a thermal treatment to thermally diffuse the second impurity diffusion layer of the second conduction type to form a second base region of the second conduction type of the second bi-polar transistor below a part of the third layer and in the semiconductor layer below a part of the fourth layer, and to electrically connect the second base region of the second conduction type and the second body region of the second conduction type, (C-8) forming a drain region of the second conduction type of the second field effect transistor in a fourth region surrounded by the second gate electrode layer, the third layer and the element isolation region, and electrically connecting the drain region of the second conduction type to the second base region of the second conduction type through the second body region of the second conduction type, (C-9) forming a source region of the second conduction type of the second field effect transistor in a part of a fifth region surrounded by the second gate electrode layer, the fourth layer and the element isolation region, (C-10) forming a second collector region of the first conduction type of the second bi-polar transistor in a part of a fifth region surrounded by the second gate electrode layer, the fourth layer and the element isolation region, and electrically connecting the second collector region of the first conduction type to the first body region of the first conduction type, (C-11) forming a second emitter region of the first conduction type of the second bi-polar transistor in a sixth region surrounded by the third layer, the fourth layer and the element isolation region, and (C-12) electrically connecting the source region of the second conduction type and the second collector region of the first conduction type;

the step (D) of electrically connecting the first collector region of the first conduction type and the second emitter region of the first conduction type; and the step (E) of electrically connecting the first gate electrode layer and the second gate electrode layer.

The second method for manufacturing a semiconductor device may also include at least one of the following embodiments.

(1) An embodiment may further comprise the step of forming a third body region of the second conduction type in the semiconductor layer below the second layer in the first element forming region and in the semiconductor layer adjacent to the element isolation region.

(2) An embodiment may further comprise the step of forming a fourth body region of the second conduction type in the semiconductor layer below the fourth layer in the second element forming region and in the semiconductor layer adjacent to the element isolation region.

(3) An embodiment may be provided wherein the first conduction type is n-type, and the second conduction type is p-type. Alternatively, an embodiment wherein the first conduction type is p-type, and the second conduction type is n-type.

(4) An embodiment may be provided wherein the semiconductor layer is a silicon layer.

Certain preferred embodiments of the present invention are described below with reference to the accompanying drawings.

Figure 2:
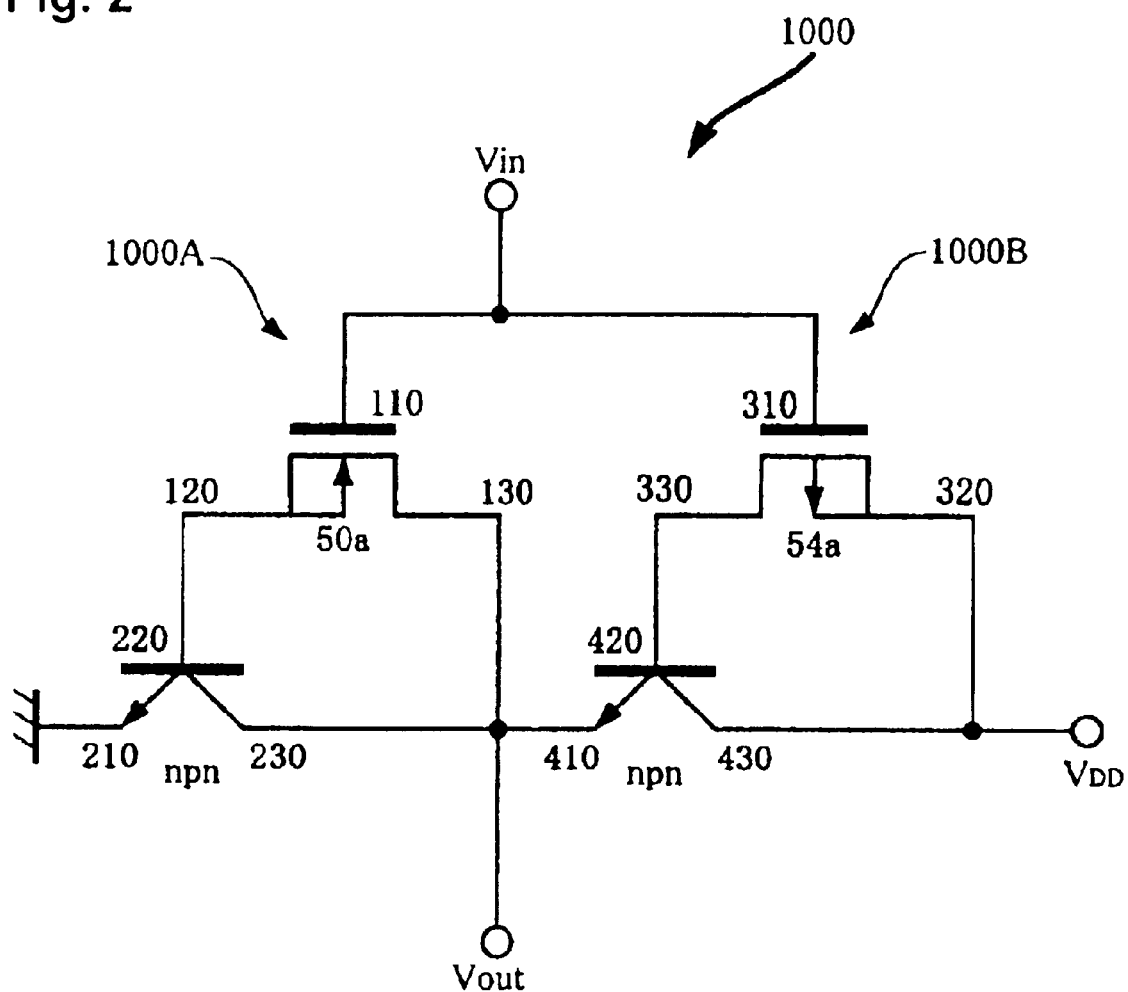
FIG. 2 shows an equivalent circuit of the semiconductor device in accordance with an embodiment of the present invention.

FIG. 1 schematically shows a plan view of a semiconductor device in accordance with one embodiment of the present invention. FIG. 2 schematically shows an equivalent circuit of the semiconductor device of the present embodiment.

A semiconductor device 1000 includes a first switch element 1000A and a second switch element 1000B. The first switch element 1000A is formed in a first element forming region 16a that is defined by element isolation regions 14. The first switch element 1000A and the second switch element 1000B form a BiCMOS inverter circuit. The first switch element 1000A and the second switch element 1000B are more specifically described below.

Figure 3:
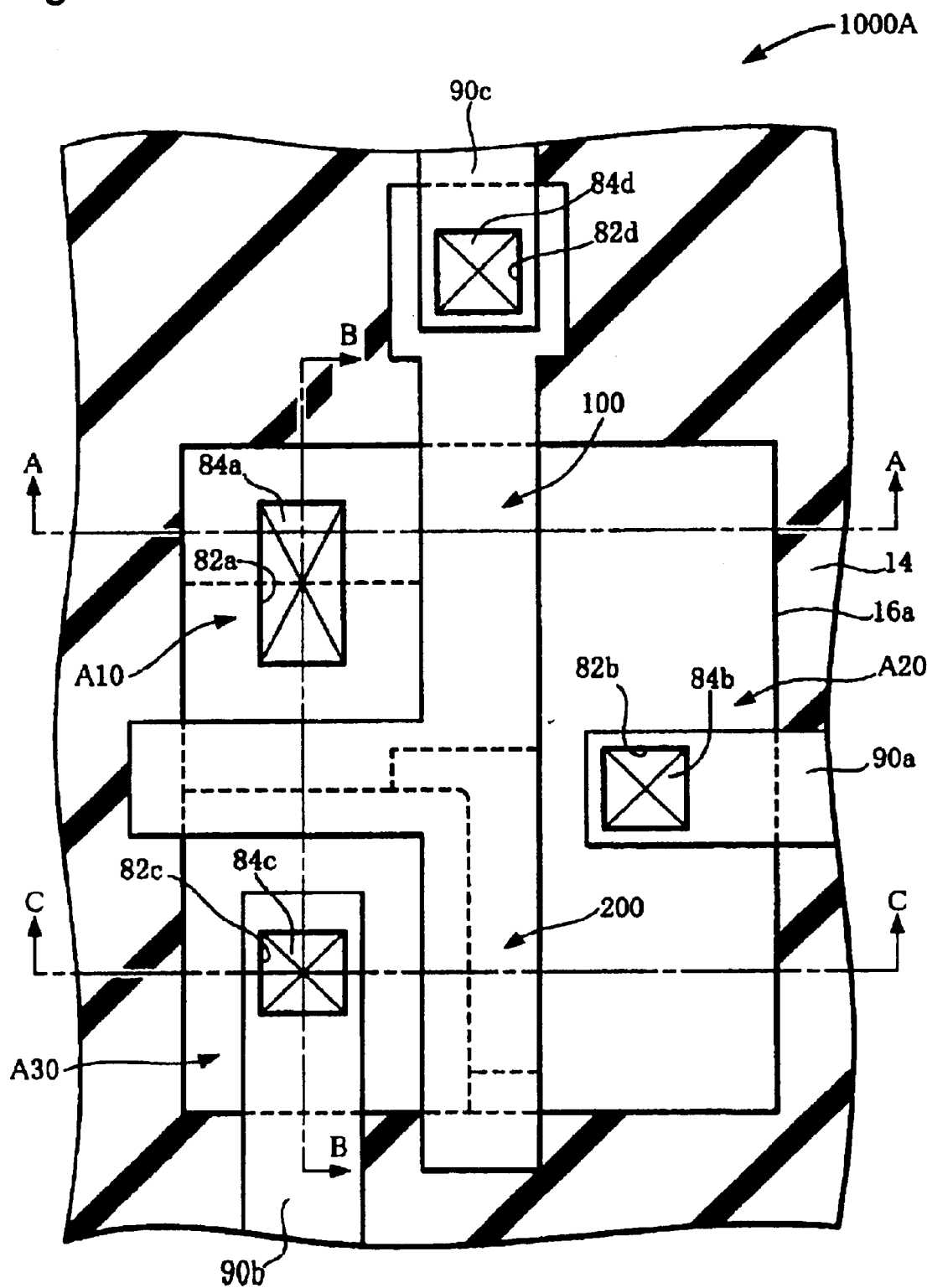
FIG. 3 schematically shows a plan view of a first switch element.
Figure 4:
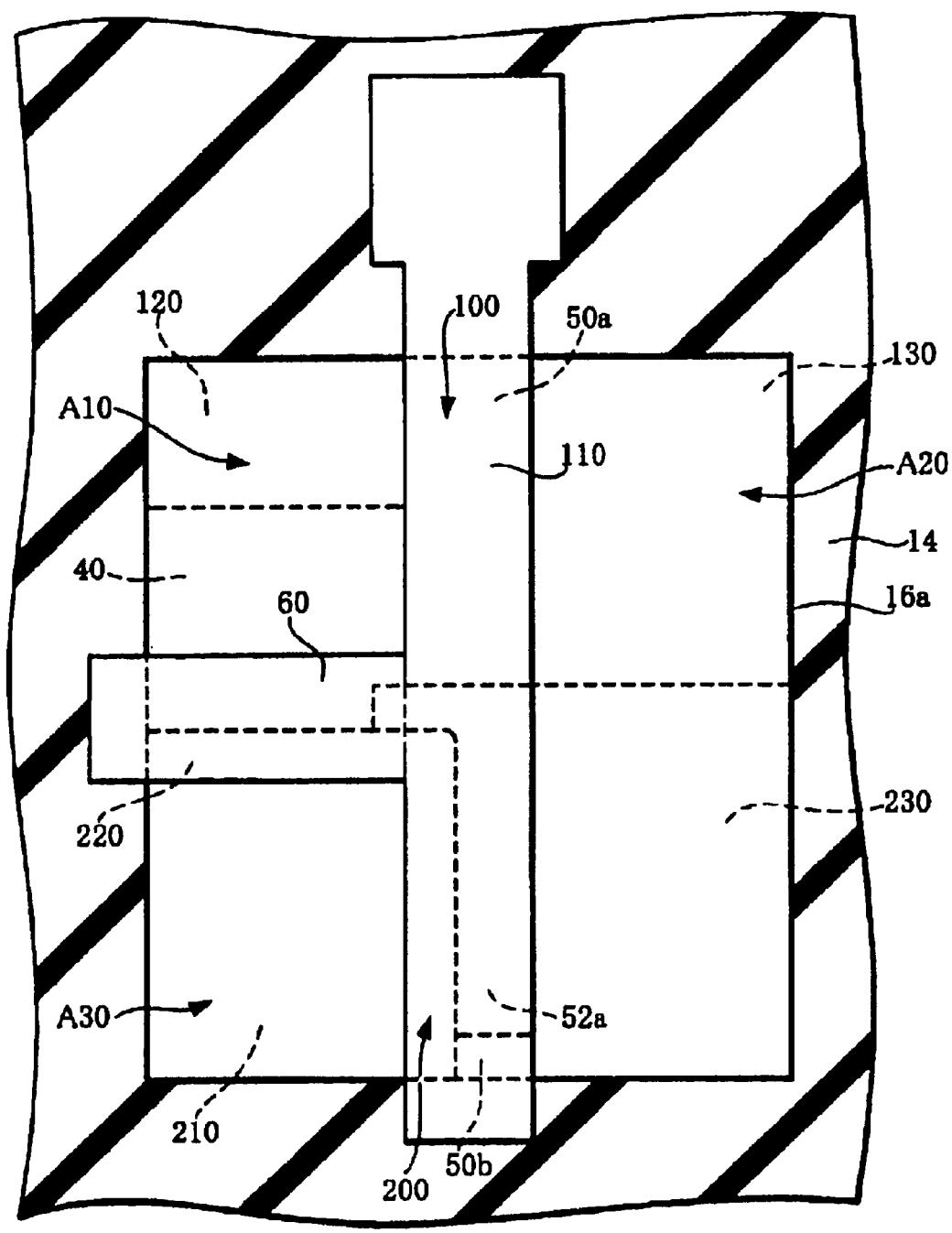
FIG. 4 schematically shows a plan view of a plane of the first switch element in a level in which a first gate electrode layer is formed.
Figure 5:
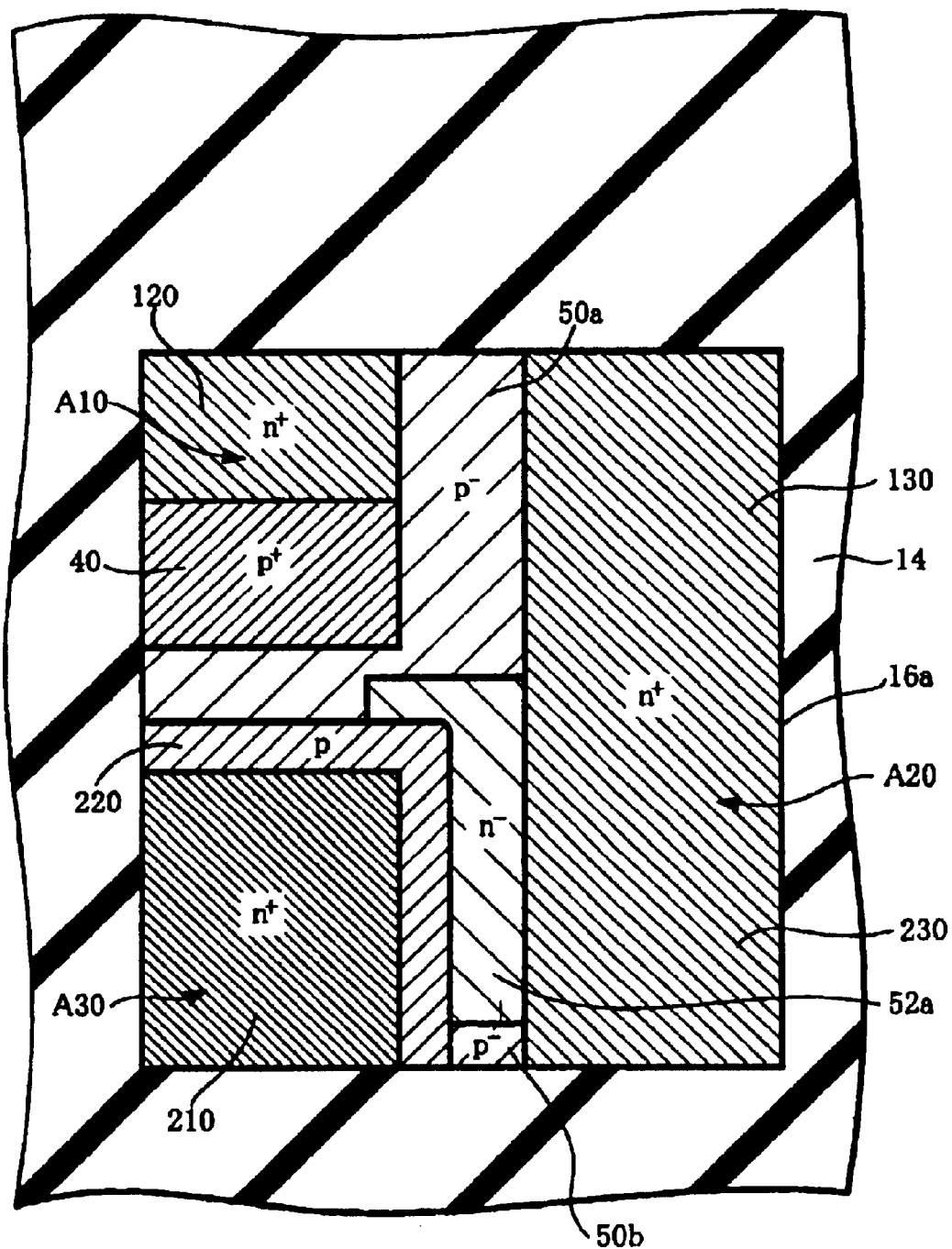
FIG. 5 schematically shows a plan view of a plane of the first switch element in a surface level of a SOI layer.
Figure 6:
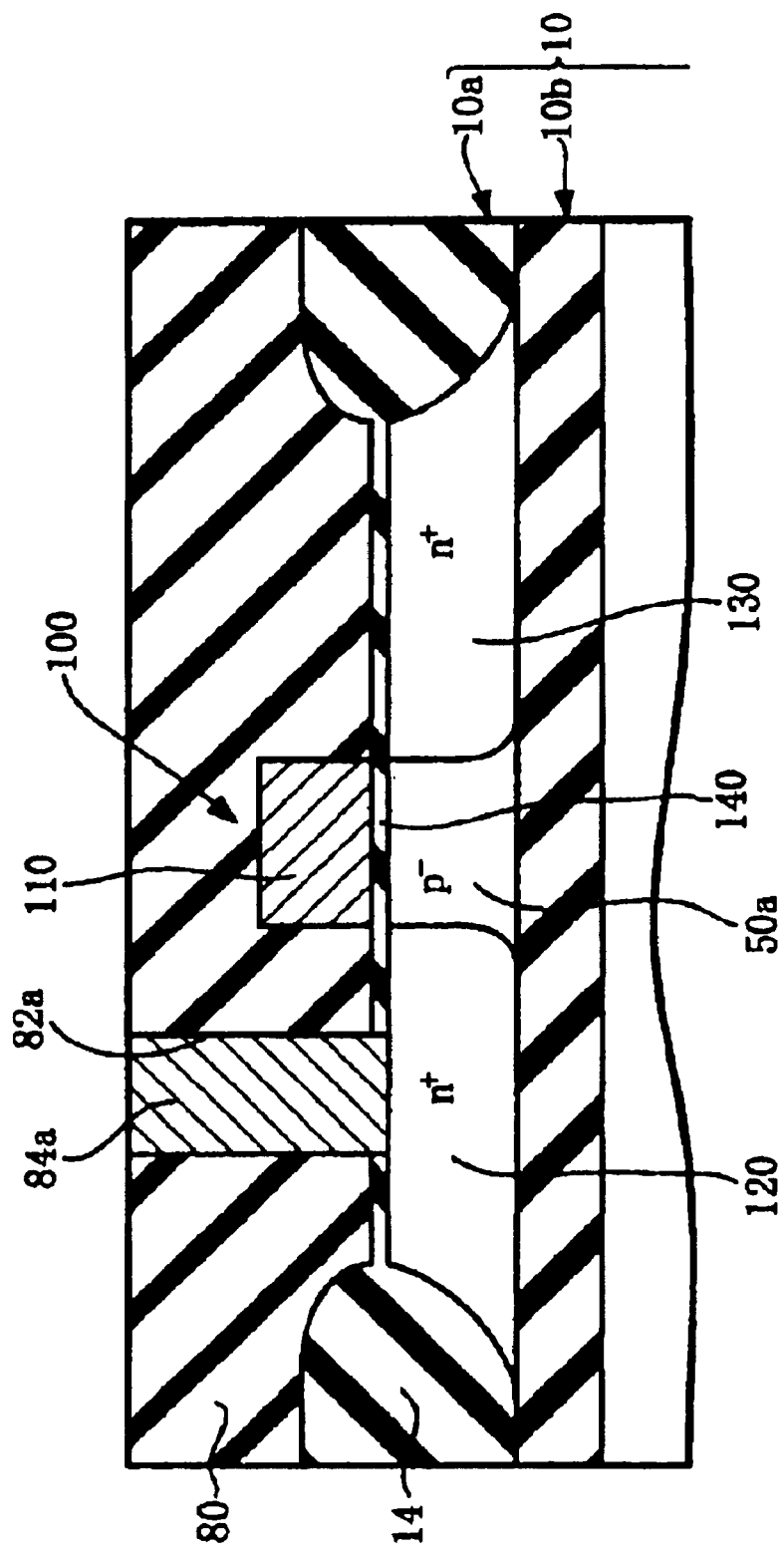
FIG. 6 schematically shows a cross-sectional view taken along a line A—A in FIG. 3.
Figure 7:
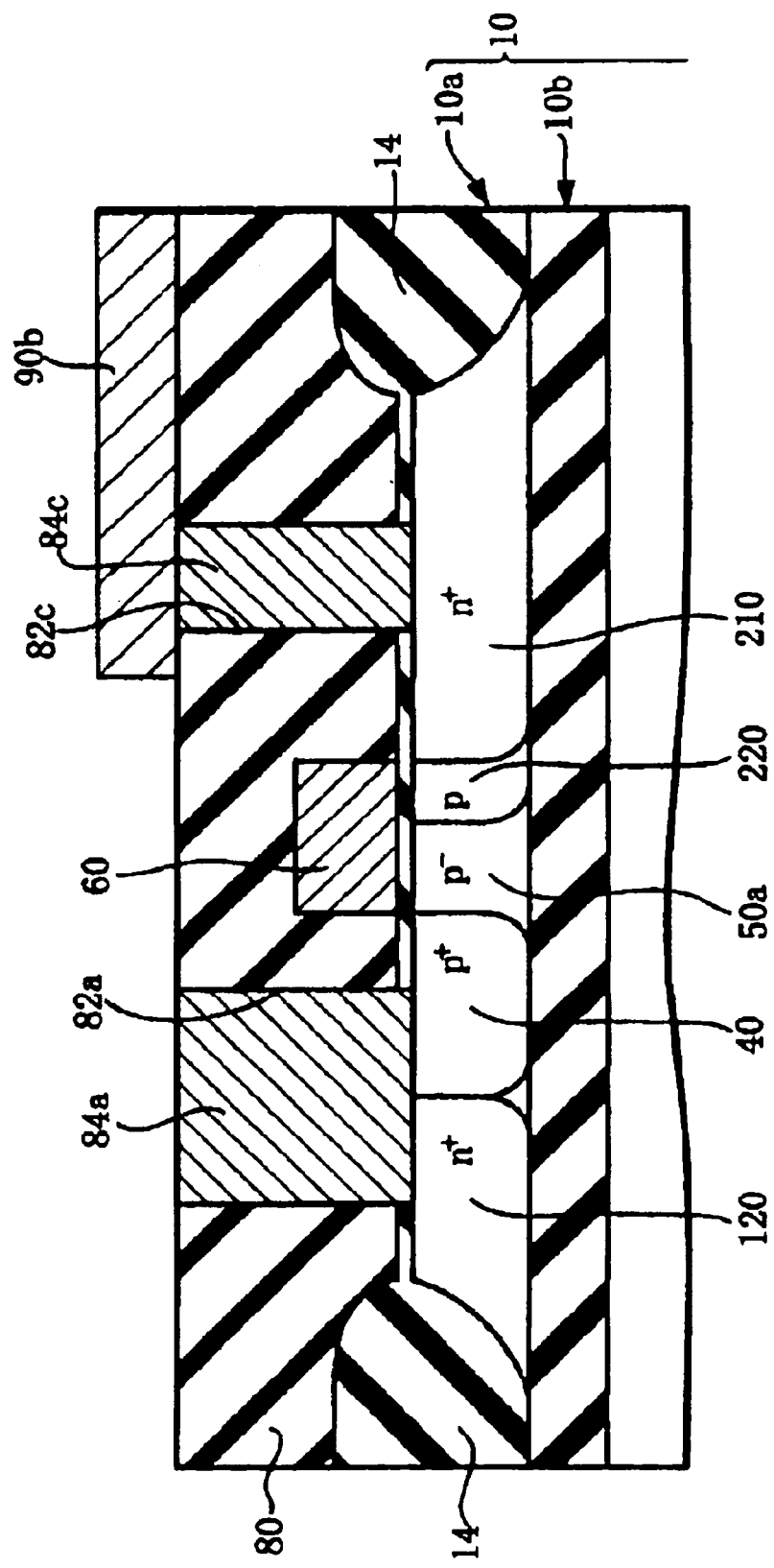
FIG. 7 schematically shows a cross-sectional view taken along a line B—B in FIG. 3.
Figure 8:
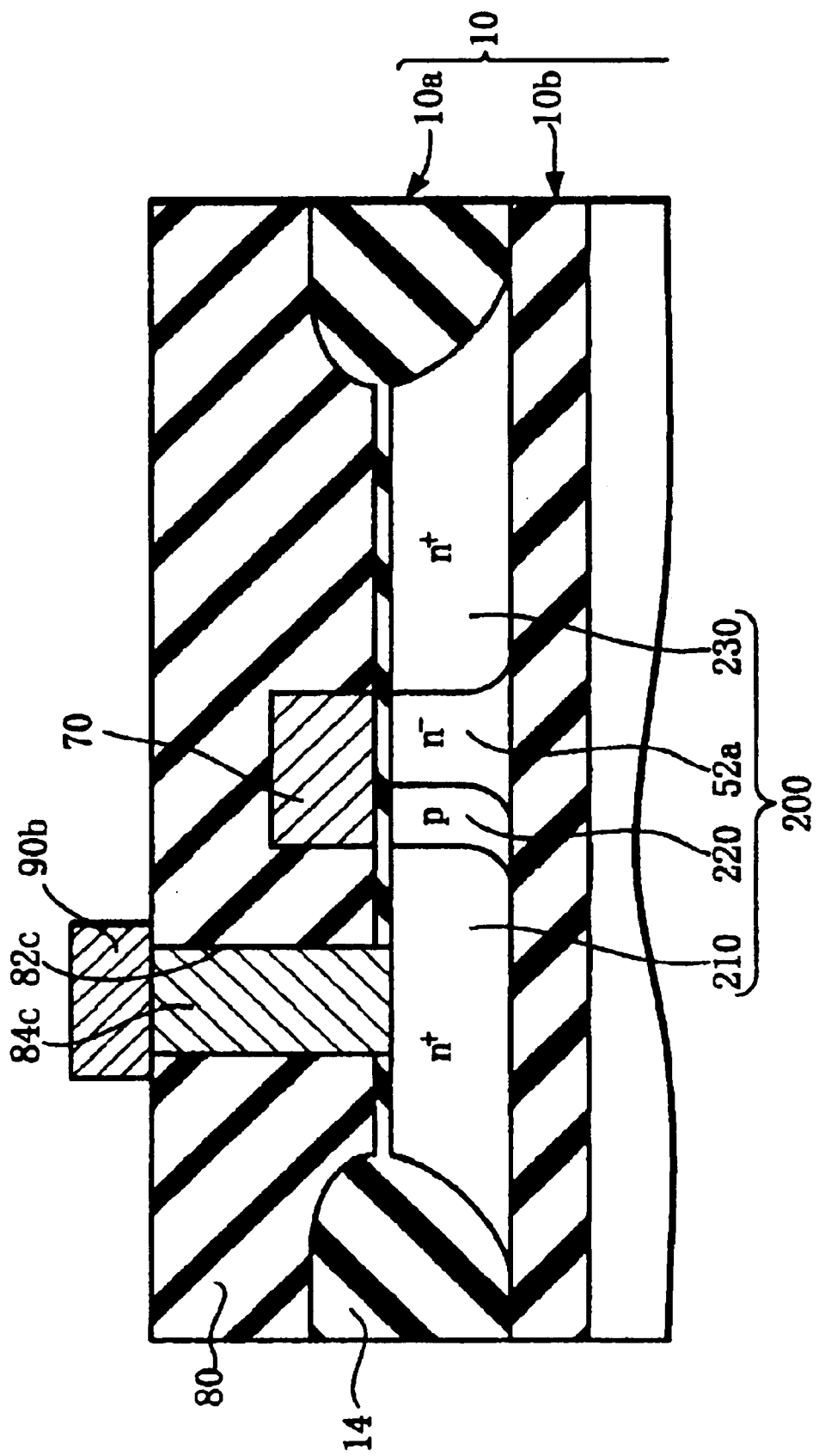
FIG. 8 schematically shows a cross-sectional view taken along a line C—C in FIG. 3.

The first switch element is described below. FIG. 3 schematically shows a plan view of the first switch element. FIG. 4 schematically shows a plan view of a plane of the first switch element in a layer in which a first gate electrode layer is formed and below that layer. FIG. 5 schematically shows a plan view of a plane of the first switch element in a layer in which a semiconductor layer is formed, more specifically, it shows a composition of an impurity diffusion layer and a body region. In FIG. 5, regions with fine hatched lines extending downwardly to the right indicate n-type regions, and regions with fine hatched lines extending downwardly to the left indicate p-type regions. FIG. 6 schematically shows a cross-sectional view taken along a line A—A in FIG. 3. More specifically, FIG. 6 schematically shows a cross-sectional view of a first field effect transistor. FIG. 7 schematically shows a cross-sectional view taken along a line B—B in FIG. 3. FIG. 8 schematically shows a cross-sectional view taken along a line C—C in FIG. 3. More specifically, FIG. 8 schematically shows a cross-sectional view of a first bi-polar transistor. In FIG. 3 through FIG. 5, regions with thick hatched lines indicate element isolation regions.

The first switch element 1000A is formed from a first field effect transistor (MOS transistor) 100 and a first bi-polar transistor 200. The first field effect transistor 100 and the first bi-polar transistor 200 are formed in the first element forming region 16a. The first field effect transistor 100 is n-type, and the first bi-polar transistor 200 is npn-type.

The first field effect transistor 100 has a first gate electrode layer 110 over gate dielectric layer 140, an n-type source region 120 and an n-type drain region 130, as shown in FIG. 6. As shown in FIG. 8, the bi-polar transistor 200 has a first n-type emitter region 210, a first p-type base region 220, a first n-type body region (second body region of a first conduction type) 52a, and a first n-type collector region 230. Compositions of the first field effect transistor 100 and the first bi-polar transistor 200 are described more specifically below.

First, referring to FIG. 4, a layer in which a first gate electrode layer 110 is formed is described. The first gate electrode layer 110 is formed in a specified region of the first element forming region 16a through a first gate dielectric layer 140 (shown in FIG. 6). More specifically, the first gate electrode layer 110 is formed in a manner to cross over the first element forming region 16a. More specifically, the first gate electrode layer 110 extends from the element isolation region 14, passing over the first element forming region 16a, again to the element isolation region 14. A first electrode layer 60 is formed at a side section of the first gate electrode layer 110. The first electrode layer 60 is formed over a specified region of the first element forming region 16a, and extends to the element isolation region 14. The first electrode layer 60 and the first gate electrode layer 110 are preferably formed in one piece.

Next, referring to FIG. 4 and FIG. 5, a layer in which the semiconductor layer 10a is formed is described. Among a region that is surrounded by the first gate electrode layer 110, the first electrode layer 60 and the element isolation region 14, a region on the side where the first field effect transistor 100 is formed is defined as a first region A10, and a region on the side where the bi-polar transistor 200 is formed is defined as a third region A30. An n-type source region 120 is formed in a part of the semiconductor layer 10a in the first region A10. The n-type source region 120 is formed from an n-type impurity diffusion layer.

A region that is surrounded by the first gate electrode layer 110 and the element isolation region 14 is defined as a second region A20. An n-type drain region 130 is formed in a part of the semiconductor layer 10a in the second region A20. Also, a first n-type collector region 230 is formed in a part of the second region A20. The n-type drain region 130 and the first n-type collector region 230 are electrically connected to each other. More specifically, the n-type drain region 130 and the first n-type collector region 230 are formed from n-type impurity diffusion layers, respectively, and preferably these n-type impurity diffusion layers are continuous to each other and formed in one piece.

A first n-type emitter region 210 is formed in the third region A30. The first n-type emitter region 210 is formed from an n-type impurity diffusion layer. The first n-type emitter region 210 is formed separated from the n-type source region 120. In other words, the first n-type emitter region 210 is structurally isolated from the n-type source region 120.

In the first element forming region 16a, a first p-type base region 220 is formed below the first gate electrode layer 110 and the first electrode layer 60 that are adjacent to the third region A30. The first p-type base region 220 is formed from a p-type impurity diffusion layer. The first p-type base region 220 is formed along a periphery of the first n-type emitter region 210.

In the first element forming region 16a, a first p-type body region 50a is formed in the semiconductor layer 10a below the first gate electrode layer 110 and in the semiconductor layer 10a below a part of the first electrode layer 60. The first p-type body region 50a is electrically connected to the first p-type base region 220 below the first electrode layer 60.

In the first element forming region 16a, a second p-type body region (a third body region of the second conduction type) 50b is formed in the semiconductor layer 10a below a second gate electrode layer 70, and in the semiconductor layer 10a adjacent to the element isolation region 14.

A p-type impurity diffusion layer 40 is formed in the first region A10 in a region other than the n-type source region 120. More specifically, the p-type impurity diffusion layer 40 is formed between the first p-type body region 50a and the n-type source region 120.

A first n-type body region 52a is formed in the semiconductor layer 10a below a part of the gate electrode layer 110 in the region where the first bi-polar transistor 200 is formed in the first element forming region 16. The first n-type body region 52a is formed between the first p-type base region 220 and the first n-type collector region 230.

Next, the portion above the semiconductor layer 10a is described with reference to FIG. 3 and FIGS. 6 through 8. An interlayer dielectric layer 80 is formed on the semiconductor layer 10a. First-fourth through holes 82a, 82b, 82c and 82d are formed in specified regions in the interlayer dielectric layer 80. The first through hole 82a is formed in the first region A10, and is formed in a manner to cross over the n-type source region 120 and the p-type impurity diffusion layer 40. The second through hole 82b is formed in the second region A20. The third through hole 82c is formed in the third region A30. The fourth through hole 82d is formed to take out the first gate electrode layer 110.

A first contact layer 84a is formed in the first through hole 82a. The first contact layer 84a has a function to electrically connect the n-type source region 120 and the p-type impurity diffusion layer 40. By this, the first p-type body region 50a and the n-type source region 120 are electrically connected to each other through the p-type impurity diffusion layer 40. Second through fourth contact layers 84b, 84c and 84d are formed in the second through fourth through holes 82b, 82c and 82d, respectively.

A first wiring layer 90a that is electrically connected to the second contact layer 84b is formed on the interlayer dielectric layer 80. Also, a second wiring layer 90b that is electrically connected to the third contact layer 84c is formed on the interlayer dielectric layer 80. The second wiring layer 90b is connected to ground. Also, a third wiring layer 90c that is electrically connected to the fourth contact layer 84d is formed on the interlayer dielectric layer 80.

Figure 9:
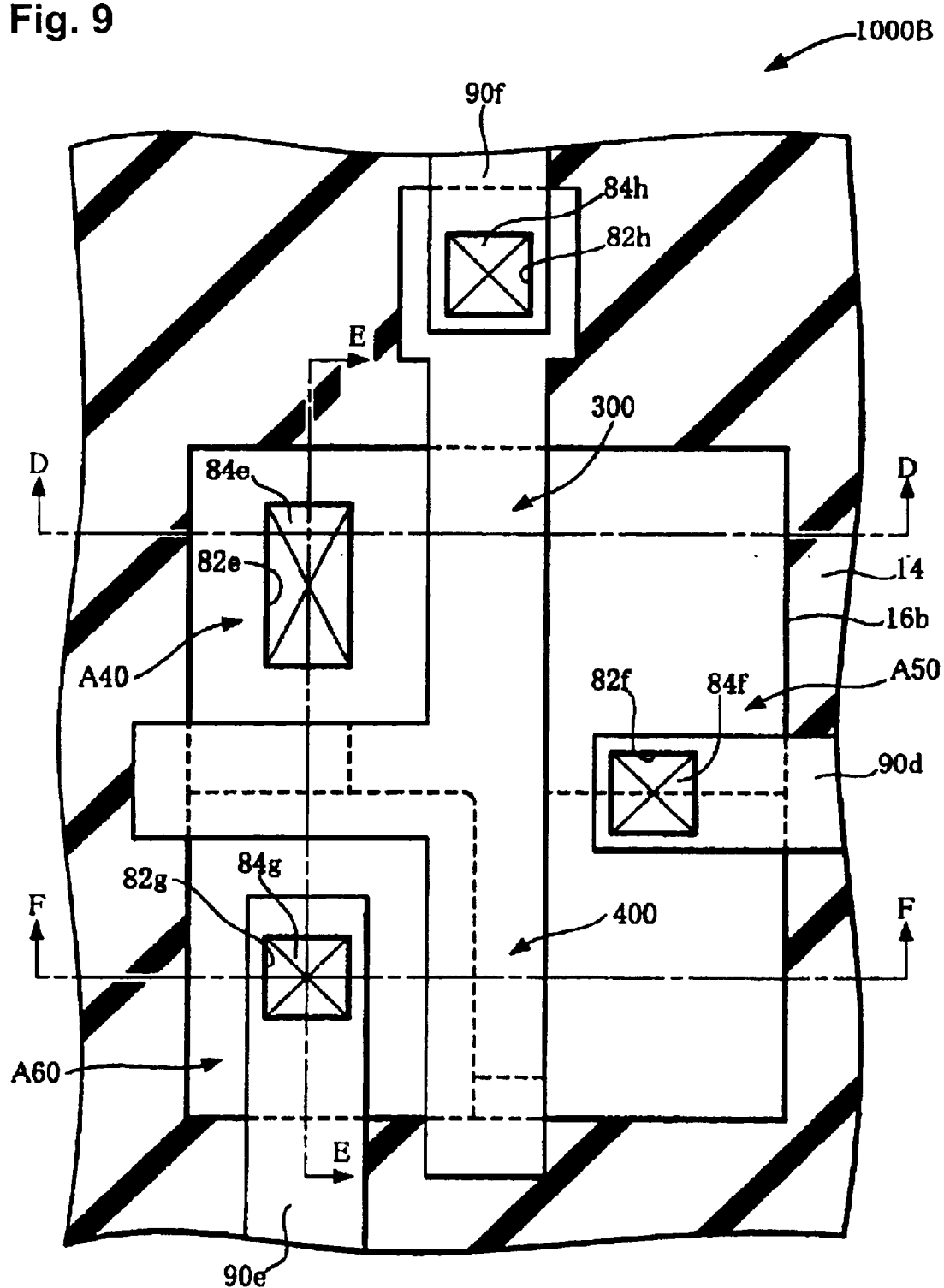
FIG. 9 schematically shows a plan view of a second switch element.
Figure 10:
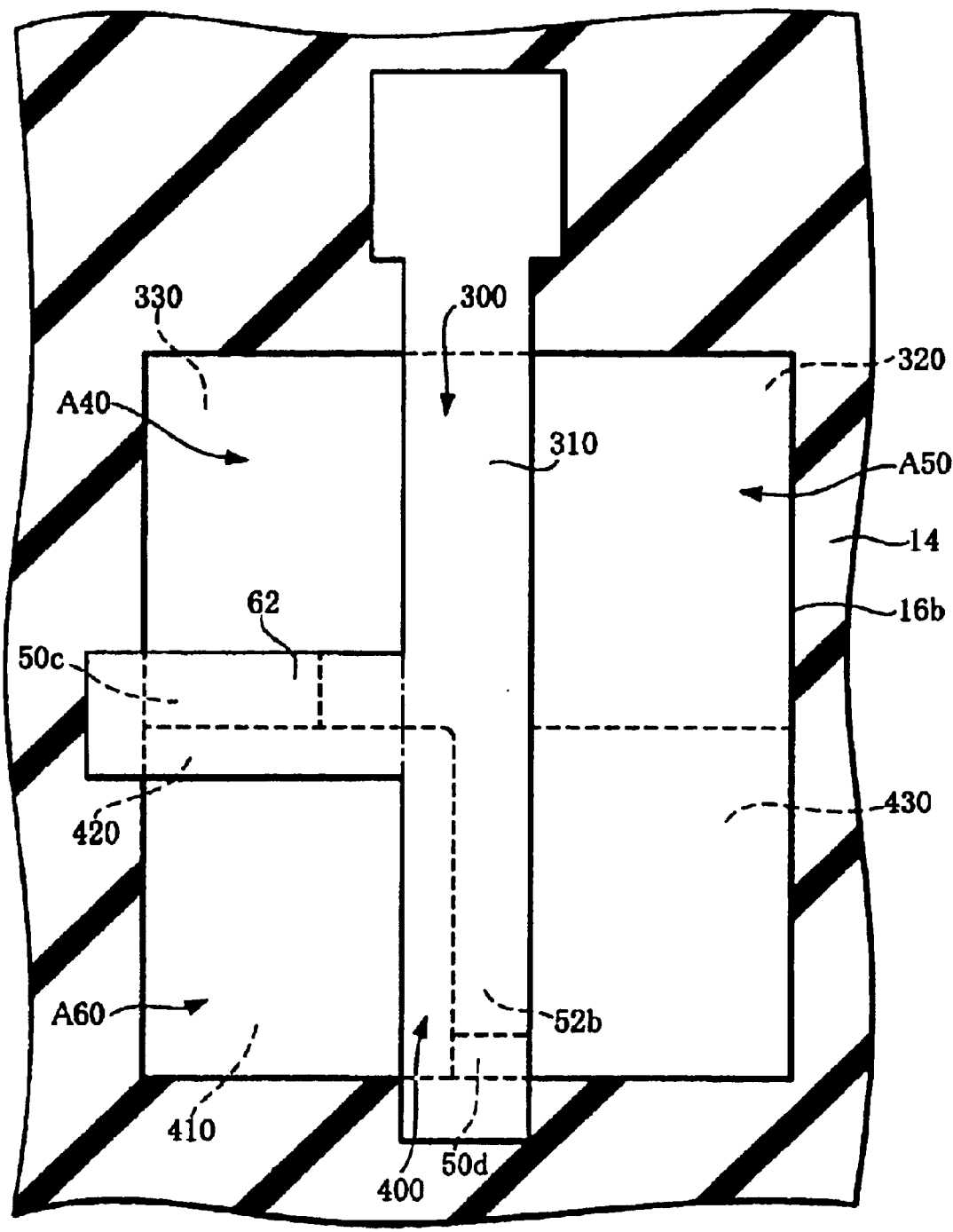
FIG. 10 schematically shows a plan view of a plane of the second switch element in a level in which a second gate electrode layer is formed.
Figure 11:
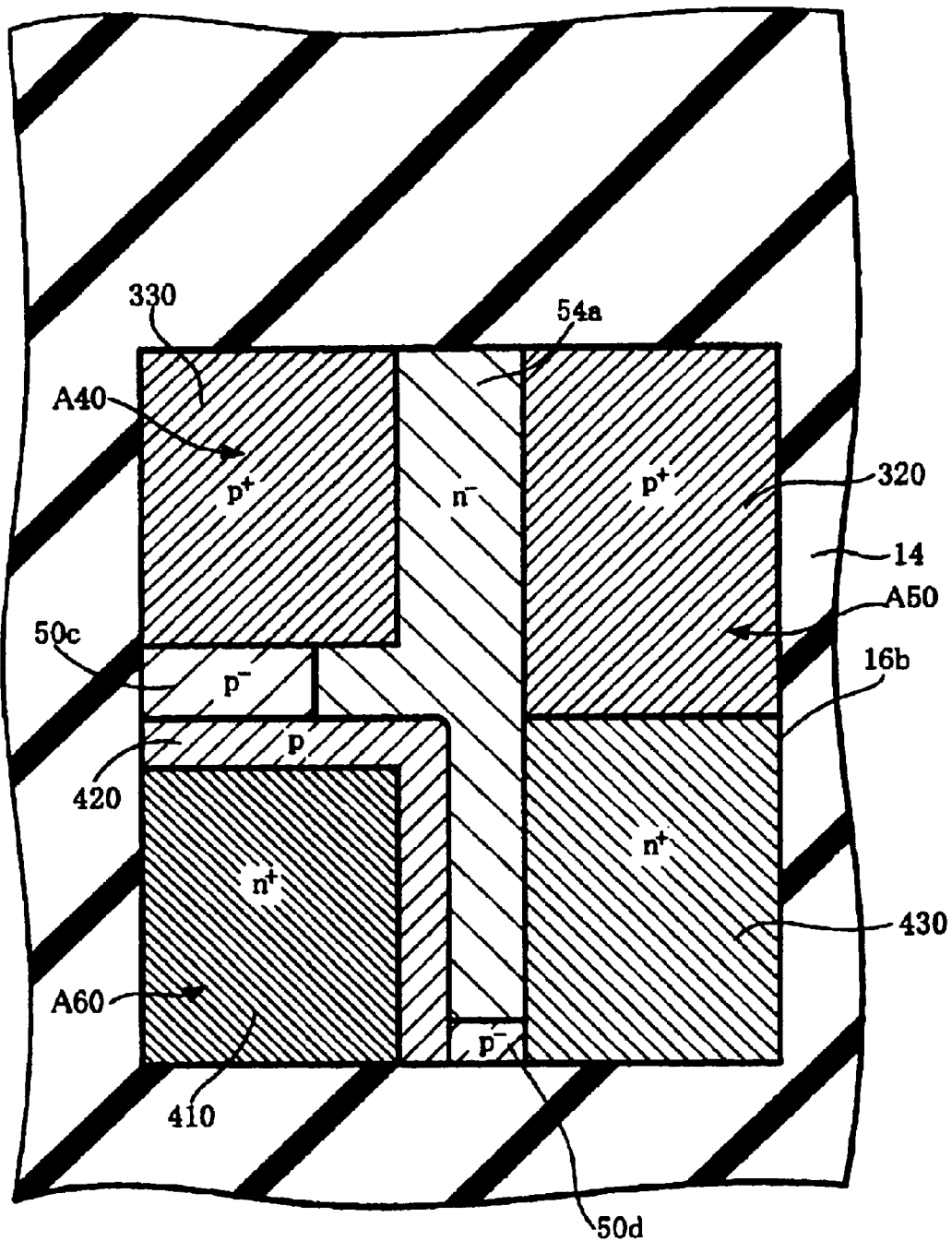
FIG. 11 schematically shows a plan view of a plane of the second switch element in a surface level of a SOI layer.
Figure 12:
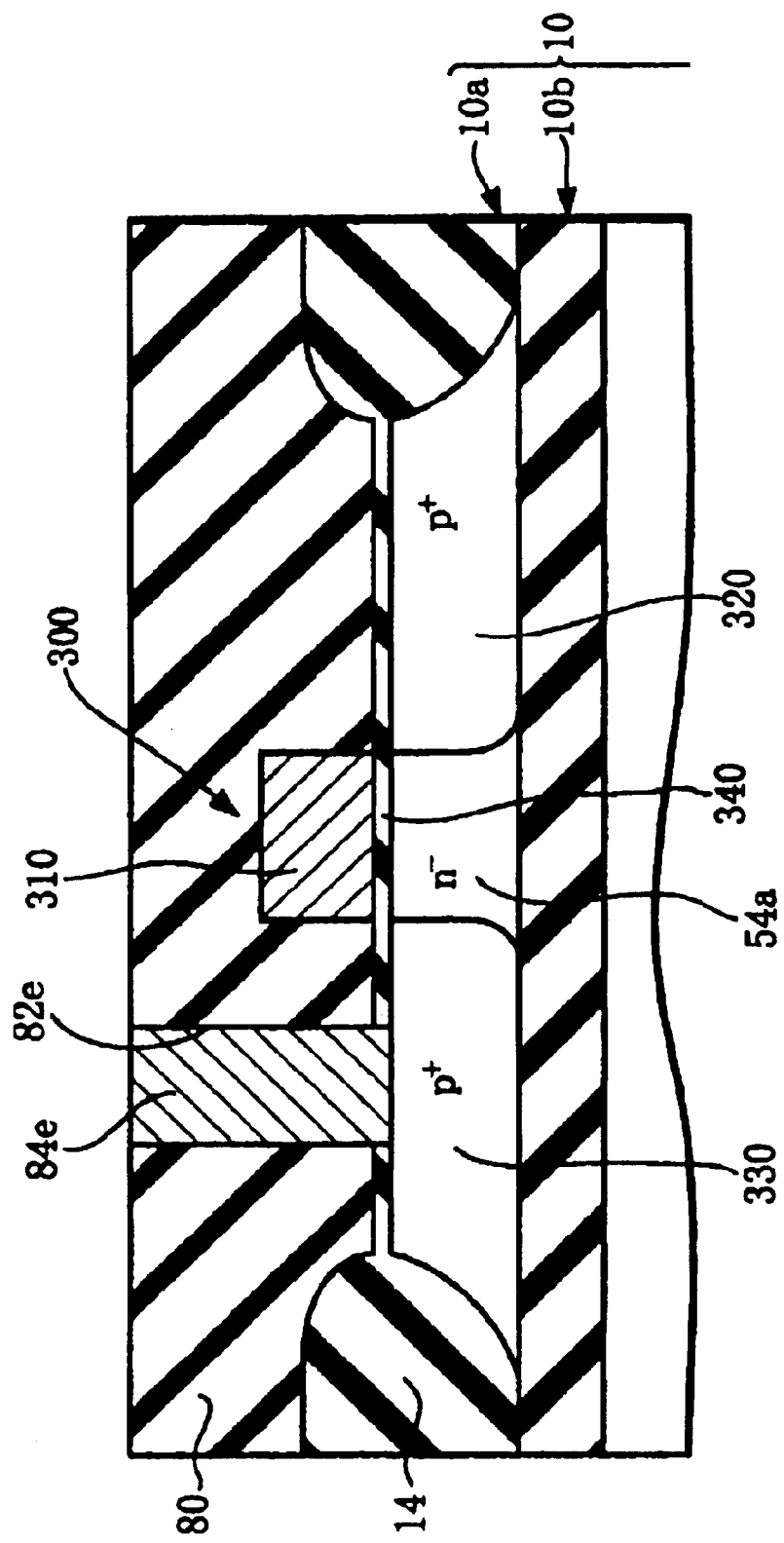
FIG. 12 schematically shows a cross-sectional view taken along a line D—D in FIG. 9.
Figure 13:
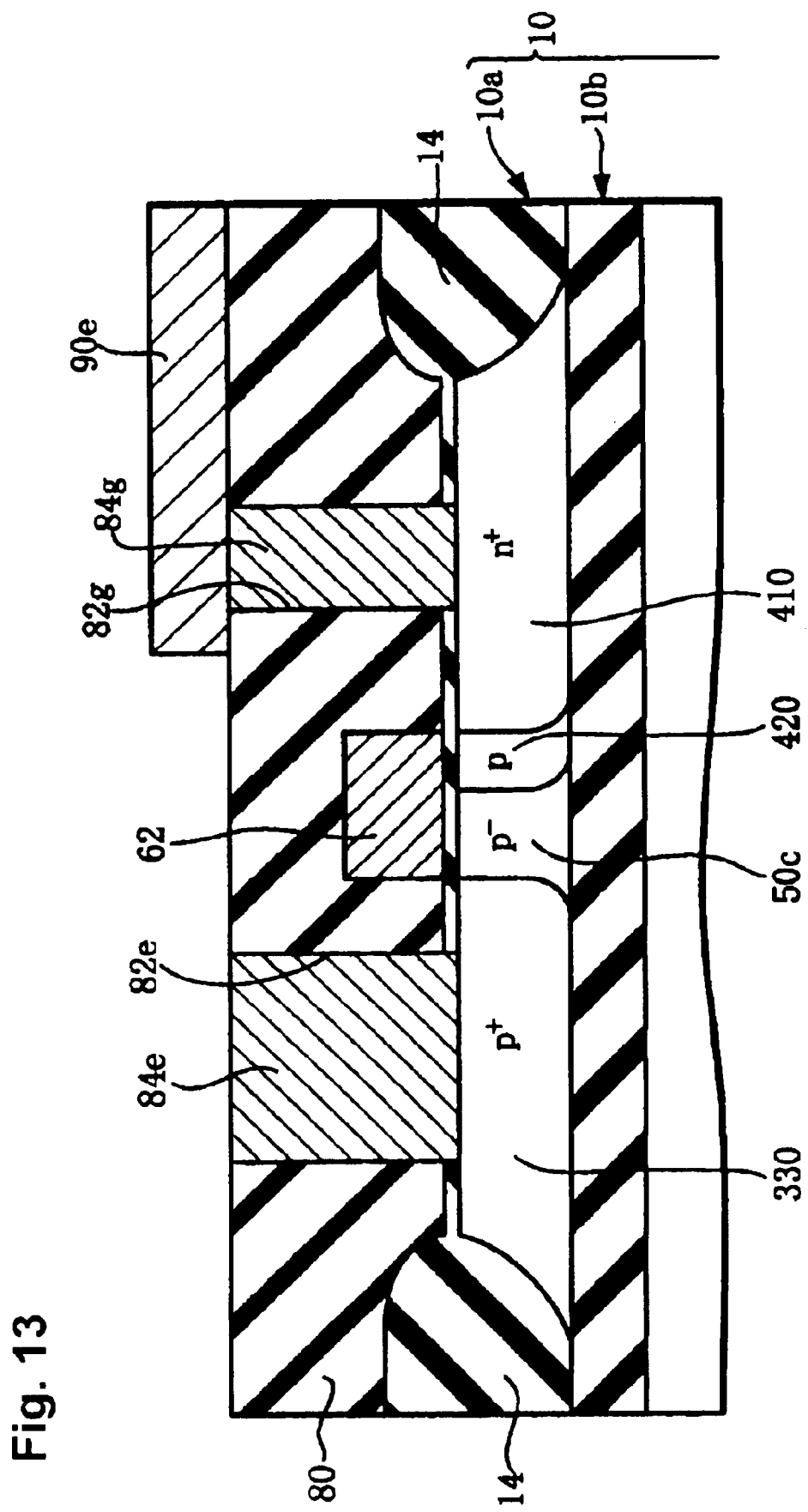
FIG. 13 schematically shows a cross-sectional view taken along a line E—E in FIG. 9.
Figure 14:
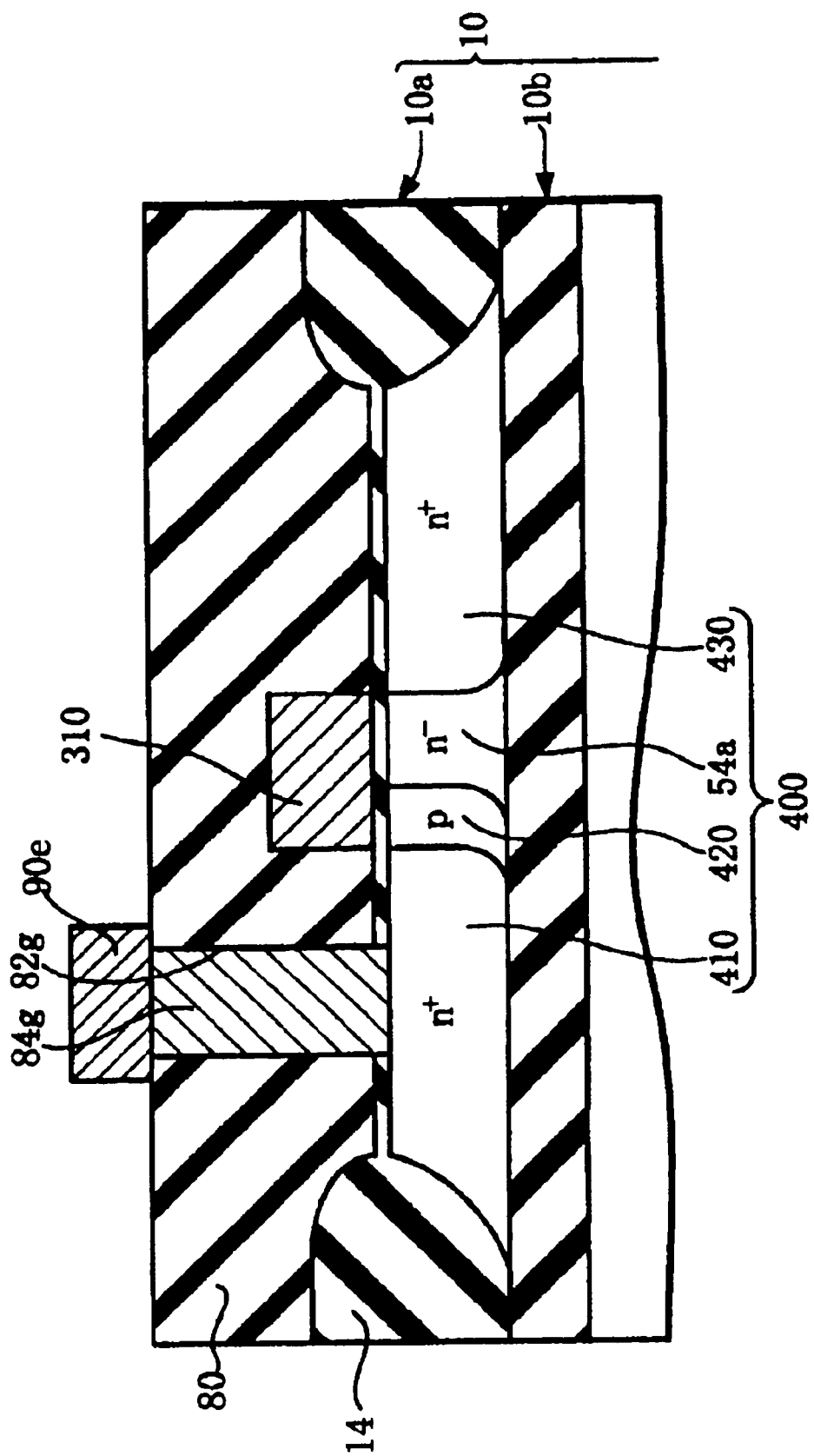
FIG. 14 schematically shows a cross-sectional view taken along a line F—F in FIG. 9.

The second switch element is described below. FIG. 9 schematically shows a plan view of the second switch element. FIG. 10 schematically shows a plan view of a plane of the second switch element in a layer in which a second gate electrode layer is formed and below that layer. FIG. 11 schematically shows a plan view of a plane of the second switch element in a layer in which a semiconductor layer is formed, more specifically, it shows a composition of an impurity diffusion layer and a body region. In FIG. 11, regions with fine hatched lines extending downwardly to the right indicate n-type regions, and regions with fine hatched lines extending downwardly to the left indicate p-type regions. FIG. 12 schematically shows a cross-sectional view taken along a line D—D in FIG. 9. More specifically, FIG. 12 schematically shows a cross-sectional view of a field effect transistor. FIG. 13 schematically shows a cross-sectional view taken along a line E—E in FIG. 9. FIG. 14 schematically shows a cross-sectional view taken along a line F—F in FIG. 9. More specifically, FIG. 14 schematically shows a cross-sectional view of a bi-polar transistor. In FIG. 9 through FIG. 11, regions with thick hatched lines indicate element isolation regions.

The second switch element 1000B is formed from a second field effect transistor (MOS transistor) 300 and a second bi-polar transistor 400. The second field effect transistor 300 and the second bi-polar transistor 400 are formed in the second element forming region 16b. The second field effect transistor 300 is p-type, and the second bi-polar transistor 400 is npn-type.

The second field effect transistor 300 has a second gate electrode layer 310, a p-type source region 320 and a p-type drain region 330, as shown in FIG. 12. As shown in FIG. 14, the second bi-polar transistor 400 has a second n-type emitter region 410, a second p-type base region 420, a second n-type body region (first body region of the first conduction type) 54a, and a second n-type collector region 430. Compositions of the second field effect transistor 300 and the second bi-polar transistor 400 are described more specifically below.

First, referring to FIG. 10, a layer in which a second gate electrode layer 310 is formed is described. The second gate electrode layer 310 is formed in a specified region of the second element forming region 16b through a gate dielectric layer 340 (shown in FIG. 12). More specifically, the second gate electrode layer 310 is formed in a manner to cross over the second element forming region 16b. More specifically, the second gate electrode layer 310 extends from the element isolation region 14, passing over the second element forming region 16a, again to the element isolation region 14. A second electrode layer 62 is formed at a side section of the second gate electrode layer 310. The second electrode layer 62 is connected to the second gate electrode layer 310. The second electrode layer 62 is formed over a specified region of the second element forming region 16b, and extends to the element isolation region 14. The second electrode layer 62 and the second gate electrode layer 310 are formed in one piece.

Next, referring to FIG. 10 and FIG. 11, a layer in which the semiconductor layer 10a is formed is described. Among a region that is surrounded by the second gate electrode layer 310, the second electrode layer 62 and the element isolation region 14, a region on the side where the second field effect transistor 300 is formed is defined as a fourth region A40, and a region on the side where the second bi-polar transistor 400 is formed is defined as a sixth region A60. A p-type source region 330 is formed in a part of the semiconductor layer 10a in the fourth region A40. The p-type source region 330 is formed from a p-type impurity diffusion layer.

A region that is surrounded by the second gate electrode layer 310 and the element isolation region 14 is defined as a fifth region A50. A p-type source region 320 is formed in a part of the semiconductor layer 10a in the fifth region A50. The p-type source region 320 is formed from a p-type impurity diffusion layer. Also, a second n-type collector region 430 is formed in a part of the semiconductor layer 10a in the first region A50. The second n-type collector region 430 is formed from an n-type impurity diffusion layer.

A second n-type emitter region 410 is formed in the sixth region A60. The second n-type emitter region 410 is formed from an n-type impurity diffusion layer.

In the second element forming region 16b, a second p-type base region 420 is formed below the second gate electrode layer 310 and the second electrode layer 62 that are adjacent to the sixth region A60. The second p-type base region 420 is formed from a p-type impurity diffusion layer. The second p-type base region 420 is formed along a periphery of the second n-type emitter region 410.

In the second element forming region 16b, a second n-type body region 54a is formed in the semiconductor layer 10a below the second gate electrode layer 310. The second n-type body region 54a is electrically connected to the second n-type collector region 430.

A third p-type body region (a second body region of the second conduction type) 50c is formed in the semiconductor layer 10a below a second electrode layer 62. The third p-type body region 50c is formed between the p-type drain region 330 and the second p-type body region 420. The third p-type body region 50c electrically connects the p-type drain region 330 and the p-type body region 420.

In the second element forming region 16b, a fourth p-type body region 50d is formed in the semiconductor layer 10a below the second gate electrode layer 310 in a region where the second bi-polar transistor is formed, and in the semiconductor layer 10a adjacent to the element isolation region 14.

Next, the portion above the semiconductor layer 10a is described with reference to FIG. 9 and FIGS. 12 through 14. An interlayer dielectric layer 80 is formed on the semiconductor layer 10a. Fifth-eighth through holes 82e, 82f, 82g and 82h are formed in specified regions in the interlayer dielectric layer 80. The fifth through hole 82e is formed in the fourth region A40. The sixth through hole 82f is formed in the fifth region A50. The sixth through hole 82f is formed in a manner to cross over the p-type source region 320 and the second n-type collector region 430. The seventh through hole 82g is formed in the sixth region A60. The eighth through hole 82h is formed to take out the second gate electrode layer 310.

Fifth through eighth contact layers 84e, 84f and 84g and 84h are formed in the firth through eighth through holes 82e, 82f, 82g and 82h, respectively. The sixth contact layer 84f has a function to electrically connect the p-type source region 320 and the second n-type collector region 430.

A fourth wiring layer 90d that is electrically connected to the sixth contact layer 84f is formed on the interlayer dielectric layer 80. Also, a fifth wiring layer 90e that is electrically connected to the seventh contact layer 84g is formed on the interlayer dielectric layer 80. Also, a sixth wiring layer 90f that is electrically connected to the eighth contact layer 84f is formed on the interlayer dielectric layer 80.

Connective relations between the first switch element 1000A and the second switch element 1000B are described below.

The first n-type collector region 230 relating to the first switch element 1000A and the second n-type emitter region 410 relating to the second switch element 1000B are electrically connected to one another. Also, the third wiring layer 90a and the sixth wiring layer 90f are electrically connected to one another. As a result, the first gate electrode layer 60 and the third gate electrode layer 62 are electrically connected to one another.

One or more effects that the semiconductor device in accordance with the present embodiment may have are described below.

(1) The first switch element 1000A in accordance with the present embodiment can prevent the substrate floating effect from occurring. In other words, changes in the threshold voltage, and occurrence of kink and history effects can be suppressed.

(2) The second switch element 1000B in accordance with the present embodiment can prevent the substrate floating effect from occurring. In other words, changes in the threshold voltage, and occurrence of kink and history effects can be suppressed.

(3) The BiCMOS inverter circuit is formed from the first and second switch elements 1000A and 1000B that suppress the substrate floating effect, and therefore its characteristic can be improved.

A method for manufacturing a semiconductor device in accordance with certain embodiments of the present invention is described below. FIGS. 15 through 20 schematically show steps for manufacturing a semiconductor device in accordance with this embodiment of the present invention. In FIGS. 16 through 20, regions with fine hatched lines extending downwardly to the left indicate p-type regions, and regions with fine hatched lines extending downwardly to the right indicate n-type regions.

Figure 15:
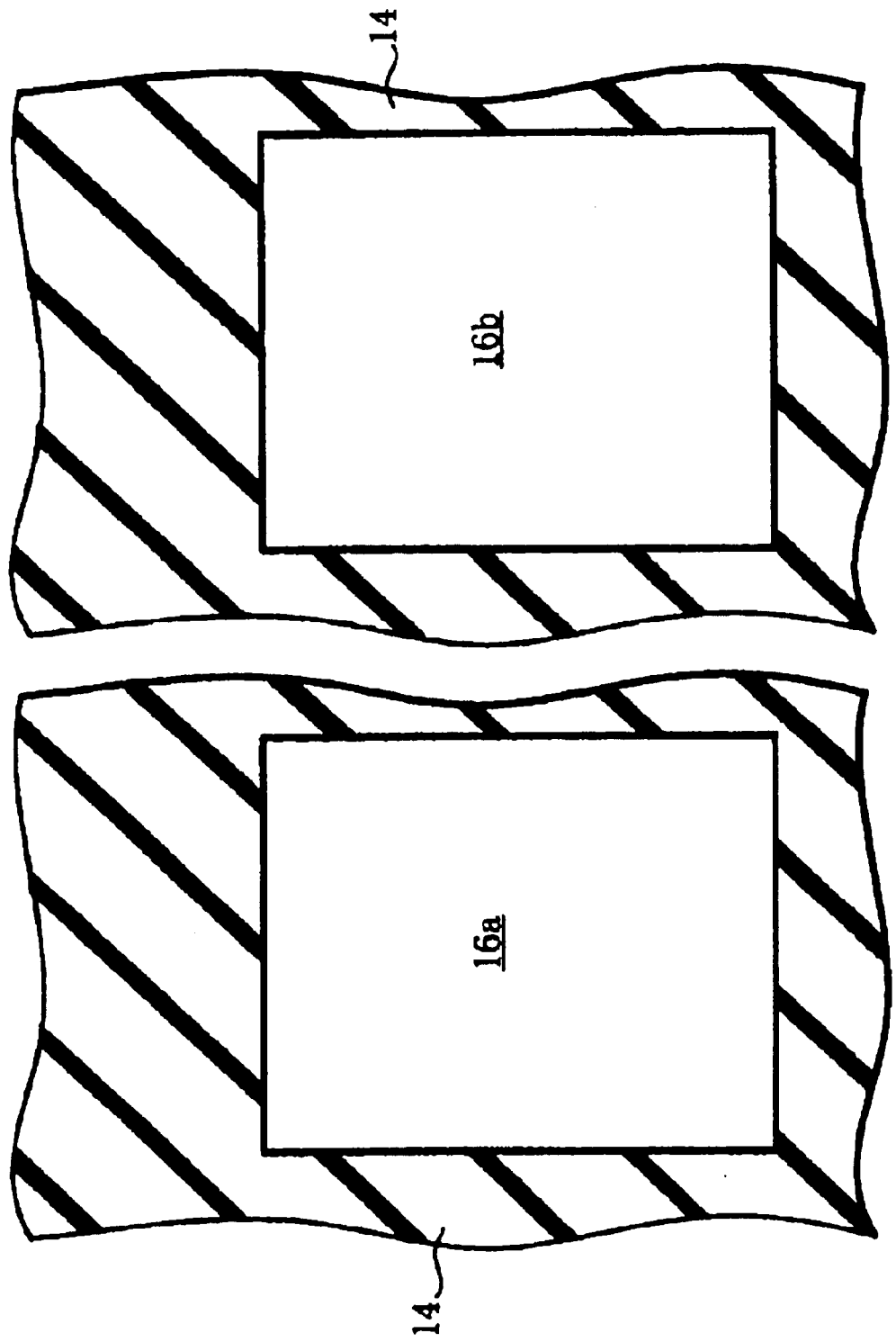
FIG. 15 schematically shows a plan view in a step of manufacturing a semiconductor device in accordance with an embodiment of the present invention.

First, as shown in FIG. 15, an element isolation region 14 is formed in a semiconductor layer 10a in a SOI substrate 10. By forming the element isolation region 14, a first element forming region 16a and a second element isolation region 16b are defined. A LOCOS method and a trench isolation method are examples of methods of forming the element isolation region 14.

Figure 16:
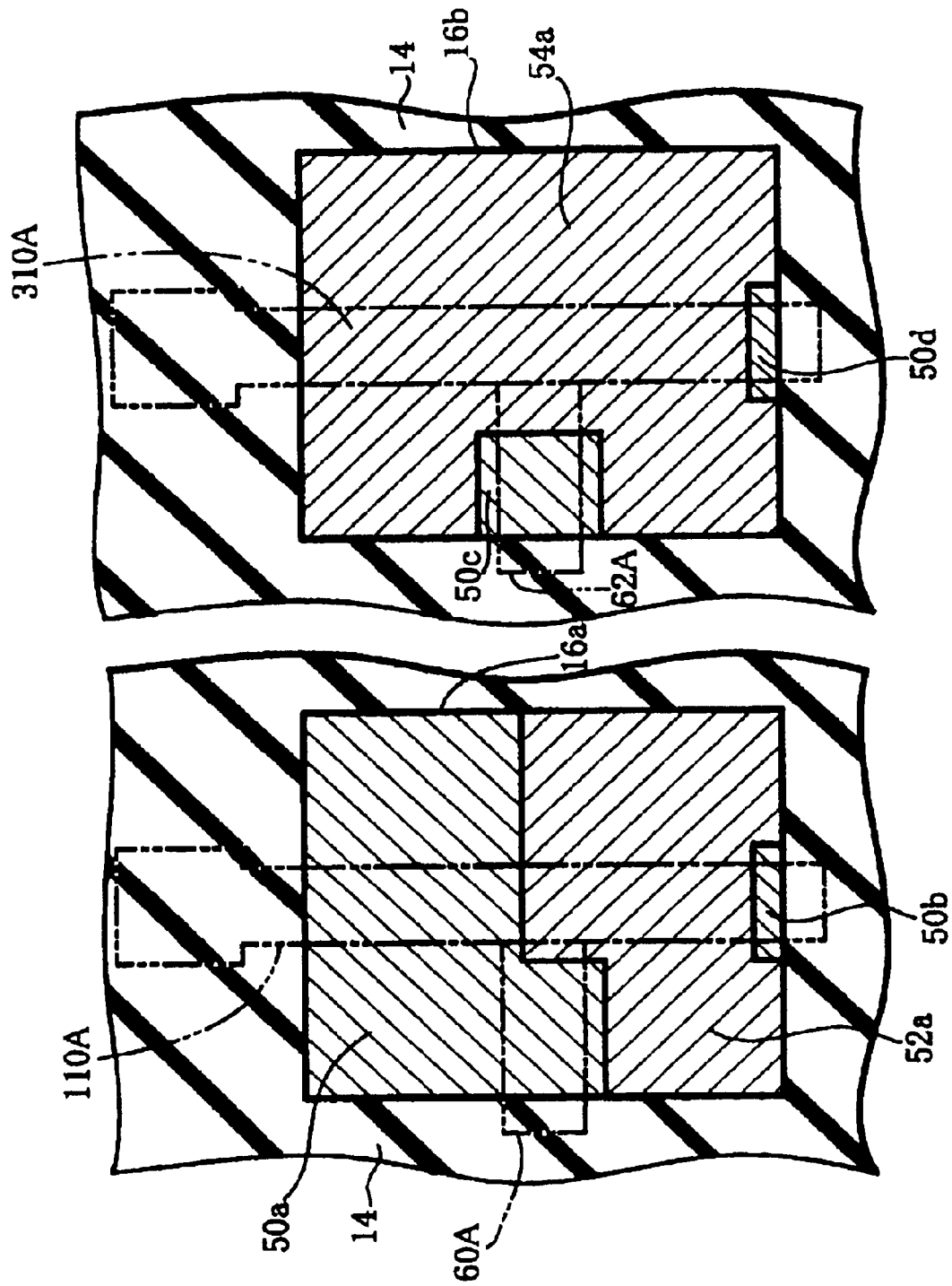
FIG. 16 schematically shows a plan view in a step of manufacturing the semiconductor device in accordance with an embodiment of the present invention.

Next, as seen in FIG. 16, using a lithography technique, n-type body regions 52a and 54a are formed by ion-implanting an n-type impurity in the area of the first and second element forming regions 16a and 16b.

Next, using a lithography technique, a p-type impurity is ion-implanted in specified regions of the first element forming region 16a to form a first p-type body regions 50a; and a p-type impurity is ion-implanted in specified regions of the second element forming region 16b to form a third p-type body region 50c. As a result of ion-implanting the p-type impurity, a first n-type body region 52a is formed in only a specified region in the first element forming region 16a, and a second n-type body region 54a is formed in only a specified region in the second element forming region 16b.

When the element isolation region 14 is formed by a LOCOS method, a second p-type body region 50b may preferably be formed in the semiconductor layer 10a in a region 110A where a first gate electrode layer is to be formed in the first bi-polar transistor side, and in the semiconductor layer 10a adjacent to the element isolation region 14. Also, when the element isolation region 14 is formed by a LOCOS method, a fourth p-type body region 50d may preferably be formed in the semiconductor layer 10a in a region 310A where a second gate electrode layer is to be formed in the second bi-polar transistor side, and in the semiconductor layer 10a adjacent to the element isolation region 14.

Figure 17:
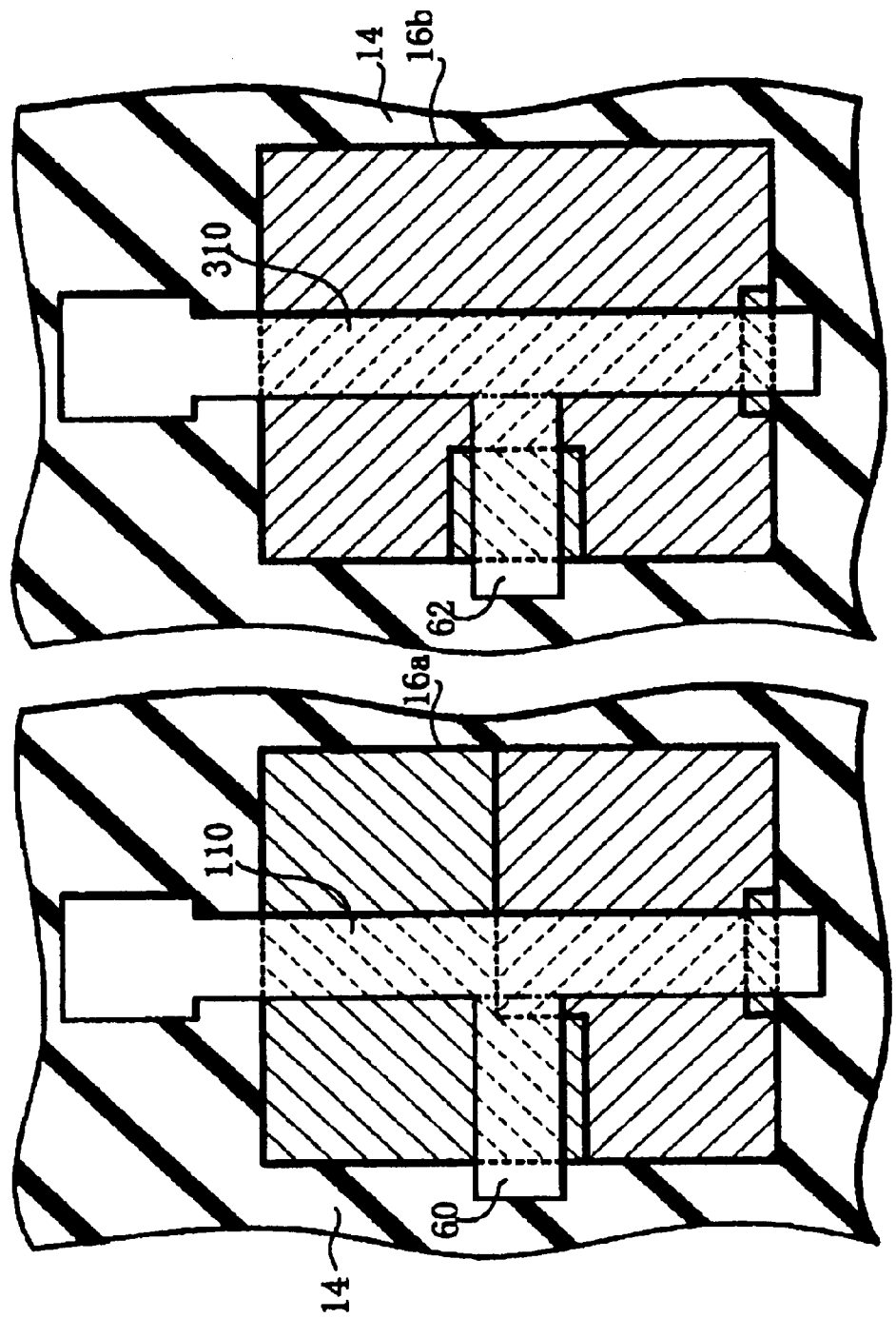
FIG. 17 schematically shows a plan view in a step of manufacturing the semiconductor device in accordance with an embodiment of the present invention.

Next, a CVD method or the like is used to deposit a polysilicon layer on the entire surface. Then, by conducting a lithography technique and an etching technique, the polysilicon layer is patterned, so as to remain thereby and form regions 110A, 60A, 310A and 62A, as shown in FIG. 16. As a result, a first gate electrode layer 110, a first electrode layer 60, a second gate electrode layer 310 and a second electrode layer 62 are formed, as shown in FIG. 17.

Figure 18:
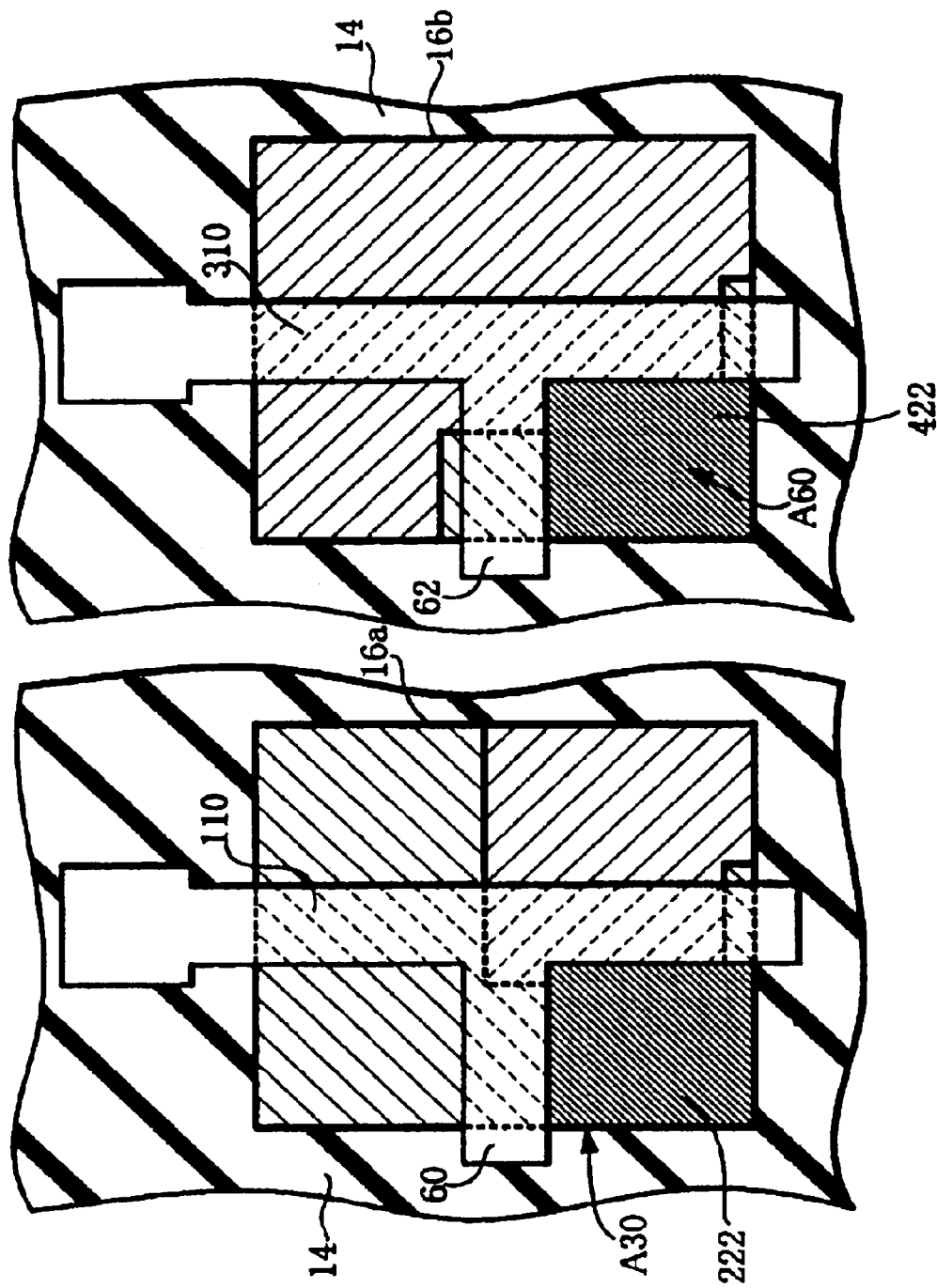
FIG. 18 schematically shows a plan view in a step of manufacturing the semiconductor device in accordance with an embodiment of the present invention.

Next, as shown in FIG. 18, by using a lithography technique, a p-type impurity is selectively ion-implanted in a third region A30, to thereby form a first p-type impurity diffusion layer 222. Also, at the same time, by using a lithography technique, a p-type impurity is selectively ion-implanted in a sixth region A60, to thereby form a second p-type impurity diffusion layer 422.

Figure 19:
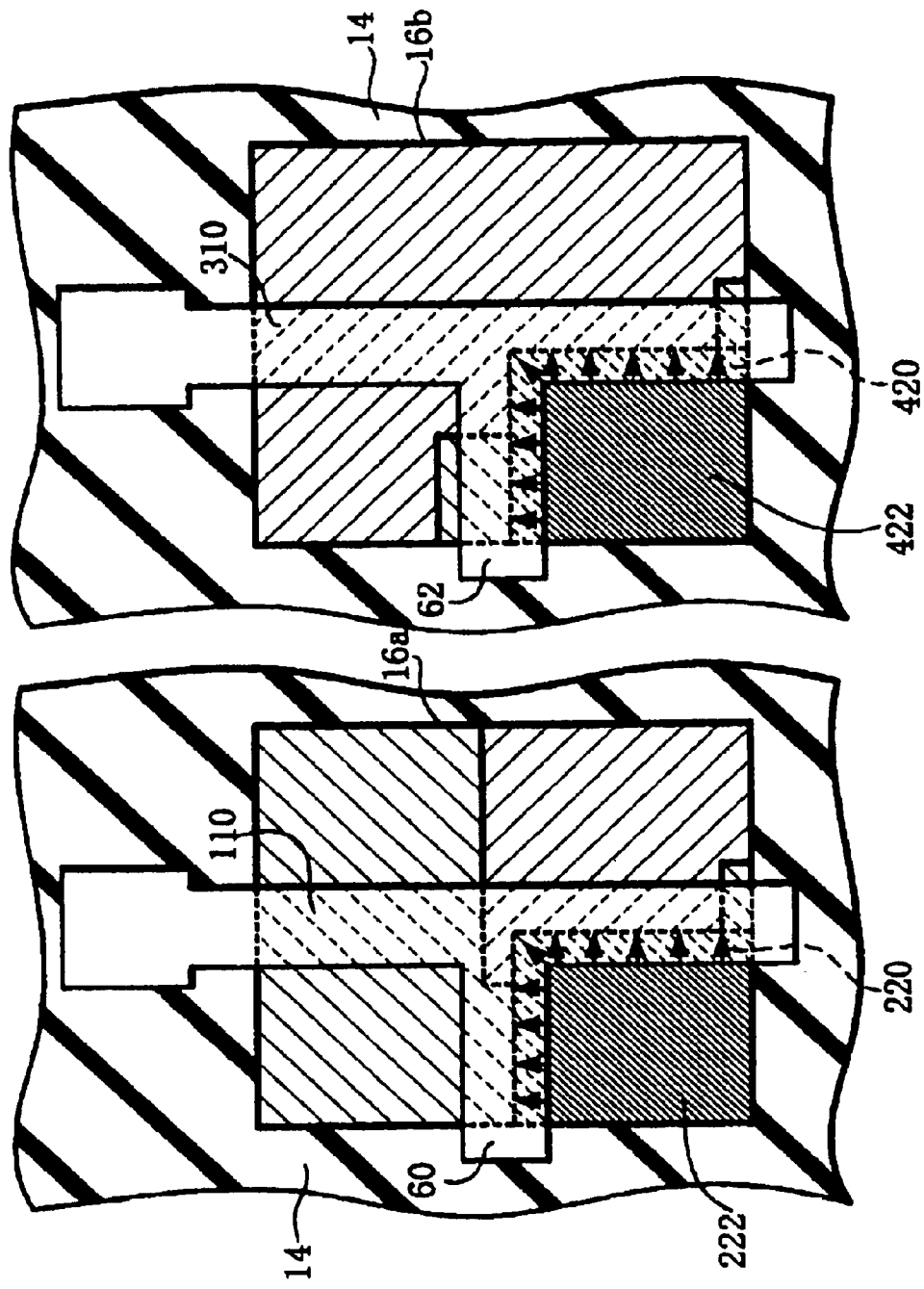
FIG. 19 schematically shows a plan view of a step of manufacturing the semiconductor device in accordance with an embodiment of the present invention.

Next, as shown in FIG. 19, the SOI substrate 10 is thermally treated to thermally diffuse the first and second p-type impurity diffusion layer 222 and 422 (as indicated by the arrows in FIG. 19). As a result, a first p-type base region 220 is formed below a part of the first gate electrode layer 110 and below the first electrode layer 60. Also, a second p-type base region 420 is formed below a part of the second gate electrode layer 310 and below the second electrode layer 62. More specifically, when the thermal treatment temperature is 1100° C., the thermal treatment time is, for example, ten minutes. When the thermal treatment temperature is 1050° C., the thermal treatment time is, for example, thirty minutes.

Figure 20:
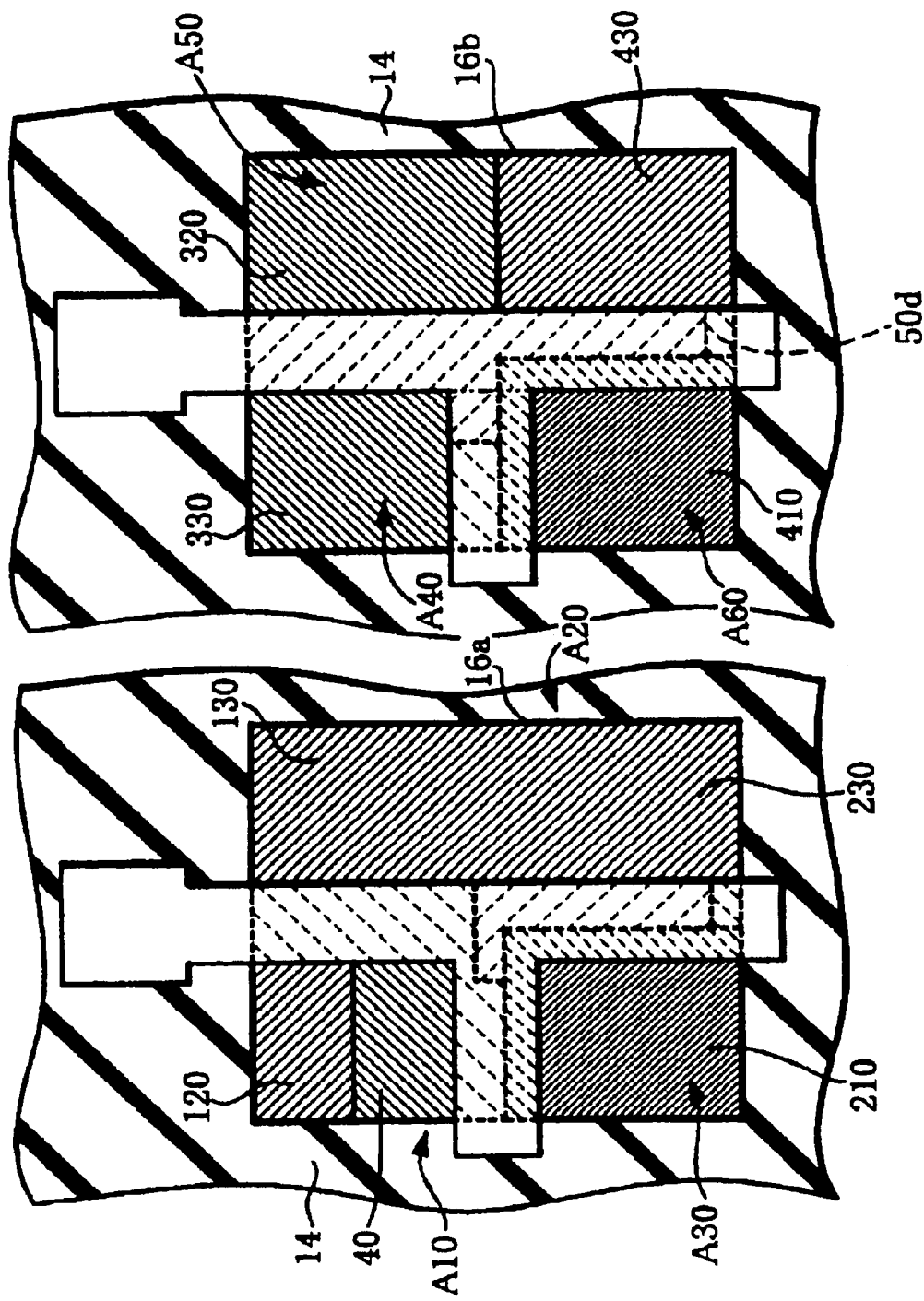
FIG. 20 schematically shows a plan view in a step of manufacturing the semiconductor device in accordance with an embodiment of the present invention.

Next, as shown in FIG. 20, by using a lithography technique, an n-type impurity is selectively ion-implanted in specified regions in the element forming region 16. By doing this, an n-type source region 120 is formed in the first region A10; an n-type drain region 130 and a first n-type collector region 230 are formed in the second region A20; and a first n-type emitter region 210 is formed in the third region A30. Also, a second collector region 430 is formed in the fifth region A50, and a second emitter region 410 is formed in the sixth region A60.

Next, by using a lithography technique, a p-type impurity is ion-implanted to form a p-type impurity diffusion layer 40 in a specified region in the first region A10, a p-type drain region 330 in the fourth region A40, and a p-type source region 320 in a specified region in the fifth region A50.

Next, as shown in FIG. 1, FIGS. 6 through 8, and FIGS. 12 through 14, an interlayer dielectric layer 80 that is formed from silicon oxide is formed on the SOI substrate 10 by a known method. Next, first-eighth through holes 82a, 82b, 82c, 82d, 82e, 82f, 82g and 82h are formed in specified regions in the interlayer dielectric layer 80. Then, conduction layers are filled in the first-eighth through holes 82a, 82b, 82c, 82d, 82e, 82f, 82g and 82h to thereby form first-eighth contact layers 84a, 84b, 84c, 84d, 84e, 84f, 84g and 84h. Next, first-sixth wiring layers 90a, 90b, 90c, 90d, 90e and 90f having specified patterns are formed on the interlayer dielectric layer 80. It is noted that the first wiring layer 90a and the fifth wiring layer 90e are electrically connected to one another, and the third wiring layer 90c and the sixth wiring layer 90f are electrically connected to one another. In this manner, the semiconductor device 1000 in accordance with the present embodiment is manufactured.

Effects which may be present in the method for manufacturing a semiconductor device in accordance with the present embodiment are described below.

(1) In accordance with the present embodiment, the first p-type impurity diffusion layer 222 is formed in the third region A30, and the first p-type impurity diffusion layer 222 is thermally treated to thereby thermally diffuse the p-type impurity to form the first p-type base region 220. As a result, the first p-type base region 220 is electrically connected to the first p-type body region 50a below the first electrode layer 60. Accordingly, by the manufacturing method in accordance with the present embodiment, the first p-type base region 220 can be electrically connected to the first p-type body region 50a without forming a contact layer for leading out the p-type base region 220.

Also, in the present embodiment, by using the first gate electrode layer 110 and the first electrode layer 60 as a mask, an n-type impurity may be ion-implanted in the third region A30 to form the first n-type emitter region 210. Accordingly, in accordance with the present embodiment, the n-type emitter region 210 can be formed in a self-alignment manner with respect to the p-type base region 220.

(2) In accordance with the present embodiment, the second p-type impurity diffusion layer 422 is formed in the sixth region A60, and the second p-type impurity diffusion layer 422 is thermally treated to thereby thermally diffuse the p-type impurity to form the second p-type base region 420. The second p-type base region 420 is electrically connected to the p-type drain region 330 through the third p-type body region 50c. Accordingly, by the manufacturing method in accordance with the present embodiment, the second p-type base region 420 can be electrically connected to the p-type drain region 330 without forming a contact layer for leading out the second p-type base region 420.

Also, in the present embodiment, by using the second gate electrode layer 310 and the second electrode layer 62 as a mask, an n-type impurity may be ion-implanted in the sixth region A60 to form the second n-type emitter region 410. Accordingly, in accordance with the present embodiment, the second n-type emitter region 410 can be formed in a self-alignment manner with respect to the second p-type base region 420.

(3) When the element isolation region 14 is formed by a LOCOS method, a second p-type body region 50b may preferably be formed in the semiconductor layer 10a below the first gate electrode layer 110 on the side of the first bi-polar transistor 200, and in the semiconductor layer 10a adjacent to the element isolation region 14. The reason for this is described below.

Figure 21:
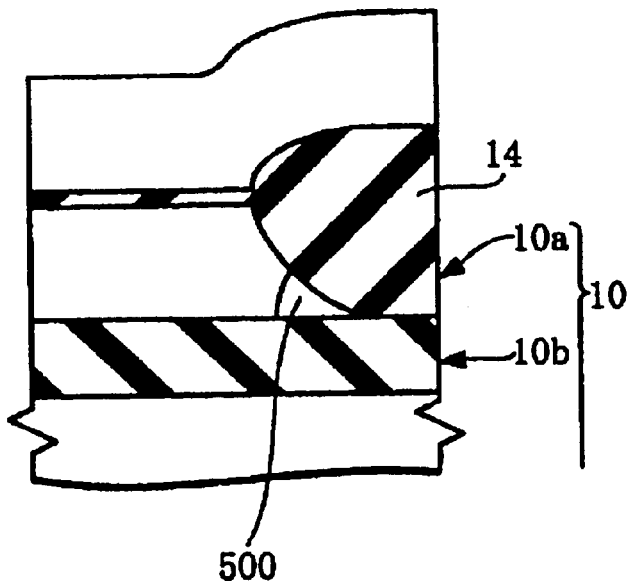
FIG. 21 schematically shows a cross-sectional view to describe effects.

When an n-type body region is formed in the semiconductor layer 10a below the first gate electrode layer 110 on the side of the first bi-polar transistor 200 and in the semiconductor layer 10a adjacent to the element isolation region 14, the following inconveniences may occur. The first p-type base region 220 is formed by thermally diffusing the first p-type impurity diffusion layer 222 in the third region A30. However, as shown in FIG. 21, the p-type impurity is difficult to thermally diffuse into a corner section that is defined by the element isolation region 14 and the insulation layer 10b, and the n-type body region 500 may remain in the corner section. If the n-type body region 500 remains, the n-type emitter region 210 and the first n-type collector region 230 are short-circuited through the n-type body region 500.

Accordingly, the second p-type body region 50b may be formed in the semiconductor layer 10a below the first gate electrode layer 110 on the side of the first bi-polar transistor 200 and in the semiconductor layer 10a adjacent to the element isolation region 14. As a result, the first n-type emitter region 210 and the first n-type collector region 230 are securely prevented or inhibited from being short-circuited.

Also, for the same reasons, a fourth p-type body region 50d may preferably be formed in the semiconductor layer 10 below the second gate electrode layer 310 on the side of the second bi-polar transistor 400 and in the semiconductor layer 10a adjacent to the element isolation region 14.

EXPERIMENTAL EXAMPLES

Experimental examples of the first switch element are described below.

Figure 22:
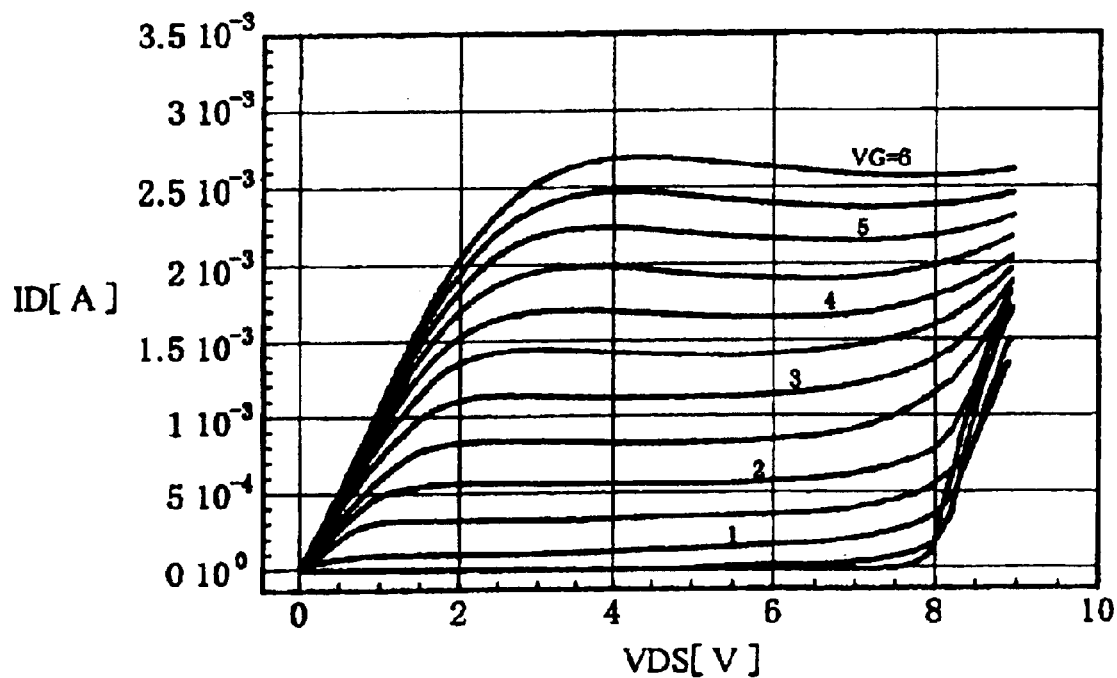
FIG. 22 shows a graph showing relations between voltages (VDS) applied to the drain region with respect to the source region in accordance with an embodiment example and drain currents (ID).
Figure 23:
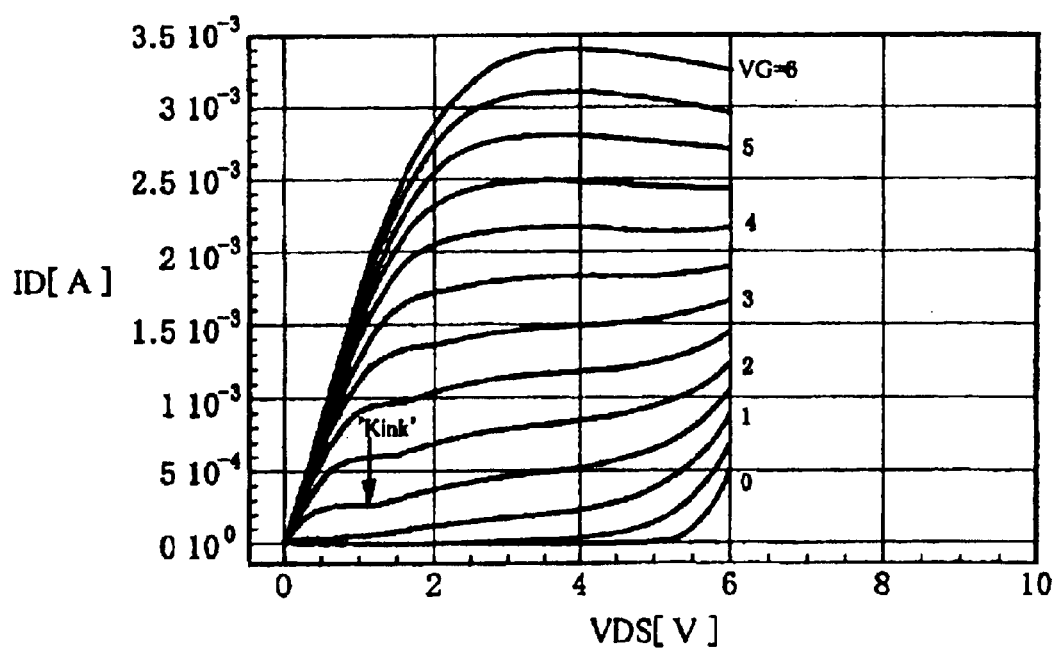
FIG. 23 shows a graph showing relations between voltages (VDS) applied to the drain region with respect to the source region in accordance with a comparison example and drain currents (ID).

Differences in the generation of kinks between a first switch element in accordance with the present embodiment example and a semiconductor device in accordance with a comparison example are investigated. FIG. 22 shows a graph showing relations between voltages (VDS) applied to the drain region with respect to the source region of the first switch element in accordance with the embodiment example and drain currents (ID). FIG. 23 shows a graph showing relations between voltages (VDS) applied to the drain region with respect to the source region in accordance with the comparison example and drain currents (ID). It is noted that VG means gate voltages.

It is noted that the first switch element of the present embodiment example has a structure that is formed from an n-type MOS transistor and an npn-type bipolar transistor. The width of the gate electrode layer in the element forming region is 0.8 μm, the length of the gate electrode layer in the forming region of the field effect transistor is 4 μm. The width of the gate electrode layer in the bi-polar transistor forming region is 0.8 μm, and the length of the gate electrode layer in the bi-polar transistor forming region is 4 μm. The comparison example has a structure of an ordinary n-type MOS transistor. In the comparison example, its gate width is 0.8 μm, and its gate length is 8 μm. First switching elements in the embodiment example and field effect transistors in the comparison example are formed on the same wafer, and under the same process conditions.

In the comparison example, as shown in FIG. 23, it is observed that kinks are generated. However, in the first switch element of the embodiment example, as shown in FIG. 22, it is observed that kinks are not generated. From the above, it is understood that the first switch element of the embodiment example can prevent generation of kinks.

Figure 24:
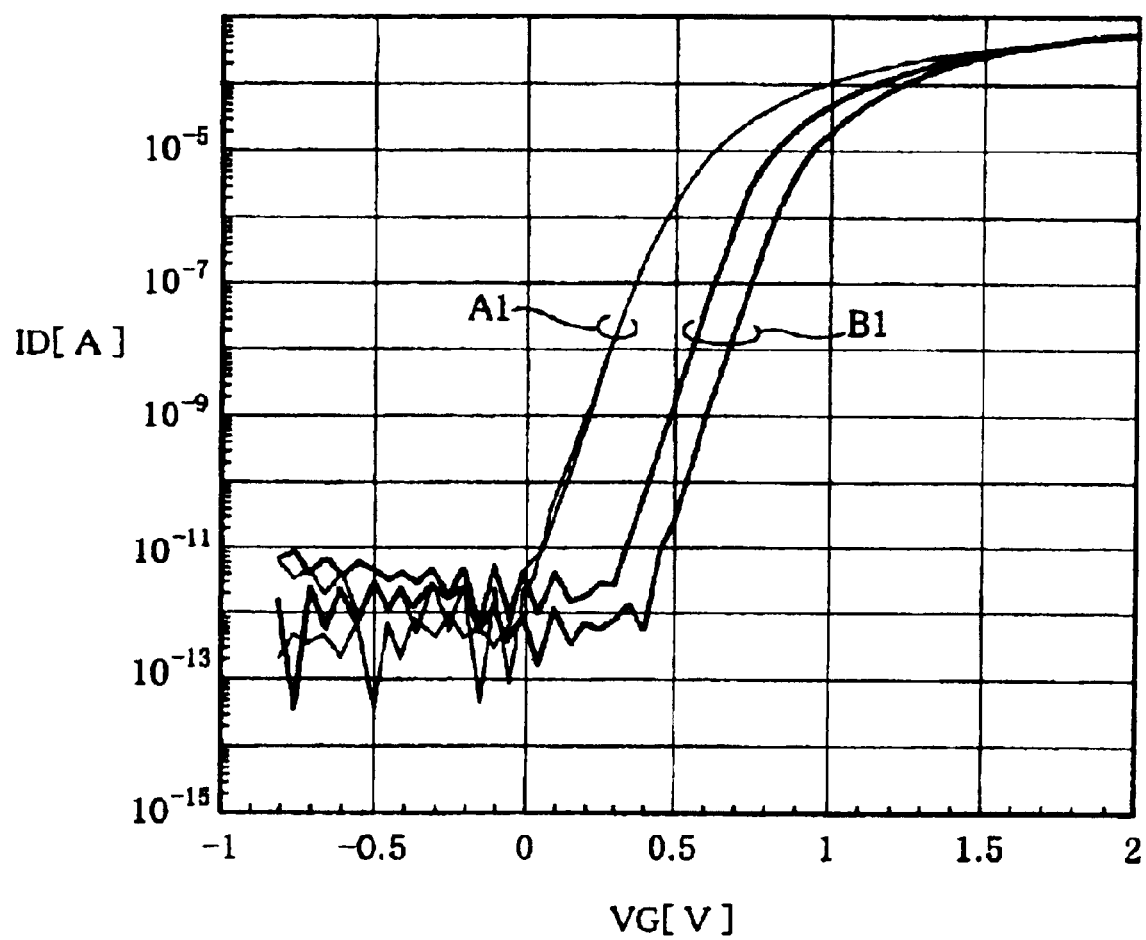
FIG. 24 shows a graph showing relations between gate voltages (VG) and drain currents (ID), which shows data obtained when a voltage applied to the drain region with respect to the source region is 1V.
Figure 25:
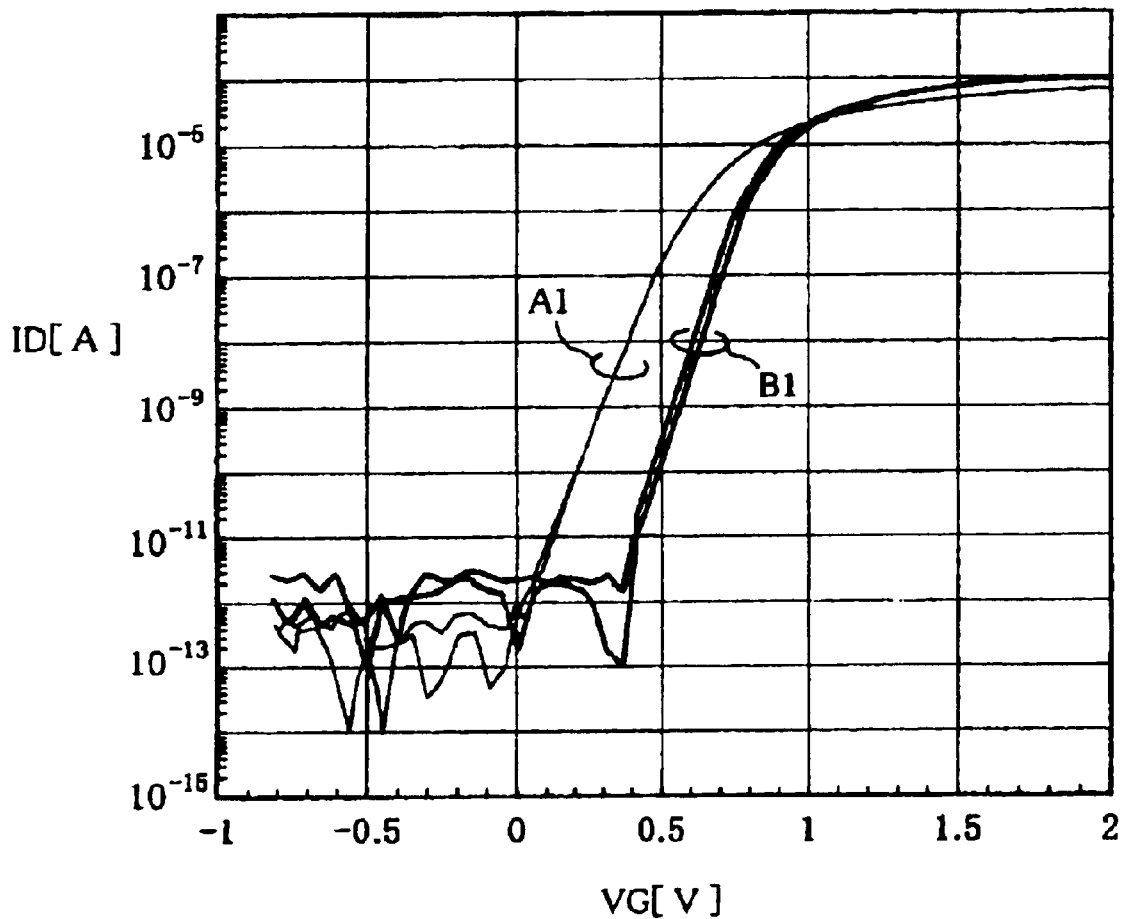
FIG. 25 shows a graph showing relations between gate voltages (VG) and drain currents (ID), which shows data obtained when a voltage applied to the drain region with respect to the source region is 0.1V.
Figure 26:
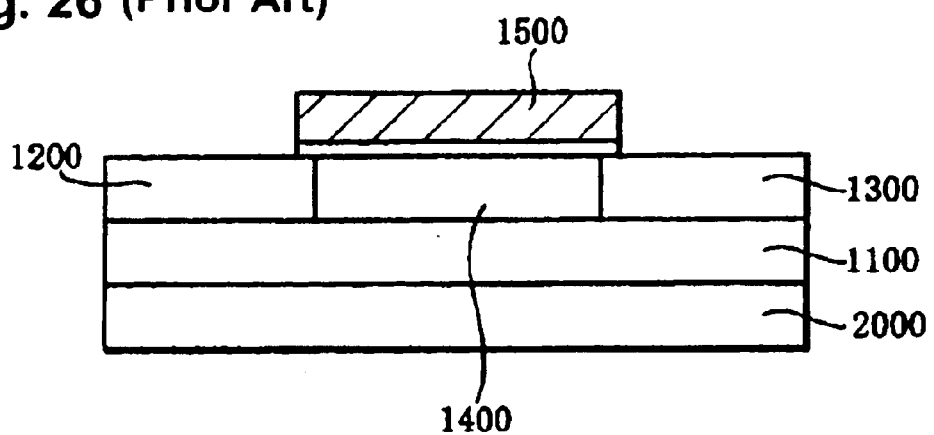
FIG. 26 schematically shows a MOS transistor formed on a SOI (Silicon-on-Insulator) substrate in a conventional example.

Differences in the generation of history effects between a first switch element in accordance with the present embodiment and a semiconductor device in accordance with a comparison example were investigated. FIG. 24 and FIG. 25 show graphs showing relations between gate voltages (VG) and drain currents (ID). FIG. 24 shows data obtained when a voltage applied to the drain region with respect to the source region is 1 V. FIG. 25 shows data obtained when a voltage applied to the drain region with respect to the source region is 0.1 V. In FIGS. 24 and 25, thin lines indicate the first switch element of the present embodiment example, and thick lines indicate the comparison example.

It is noted that, in FIG. 24 and FIG. 25, the graph A1 shows data for the first switch element of the present embodiment, and the graph B1 shows data for the comparison example. Also, the first switch element of the present embodiment and the switch element of the comparison example have the same conditions as those described in the above with respect to kinks.

First, the experimental data shown in FIG. 24 is considered. In the comparison example, the history effect appears noticeably. On the other hand, in the first switch element of the present embodiment, the history effect is slightly observed when the gate voltage is about 0.25 V or lower, but it is observed that the history effect is substantially suppressed compared to the comparison example.

Next, the experimental data shown in FIG. 25 is considered. In the comparison example, the history effect is observed when the gate voltage is about 0.8 V or lower. On the other hand, in the first switch element of the present embodiment, the history effect is observed when the gate voltage is about 0.15 V or lower. In other words, in accordance with the first switch element of the present embodiment, the range of gate voltages in which the history effect is not generated is wider compared with the comparison example.

Modified Examples

A variety of modifications can be made in accordance with embodiments of the present invention.

(1) In the embodiment described above, the first field effect transistor is n-type, the first bi-polar transistor is npn-type, the second field effect transistor is p-type, and the second bi-polar transistor is npn-type. However, the first field effect transistor may be p-type, the first bi-polar transistor may be pnp-type, the second field effect transistor may be n-type, and the second bi-polar transistor may be pnp-type.

Figure 27:
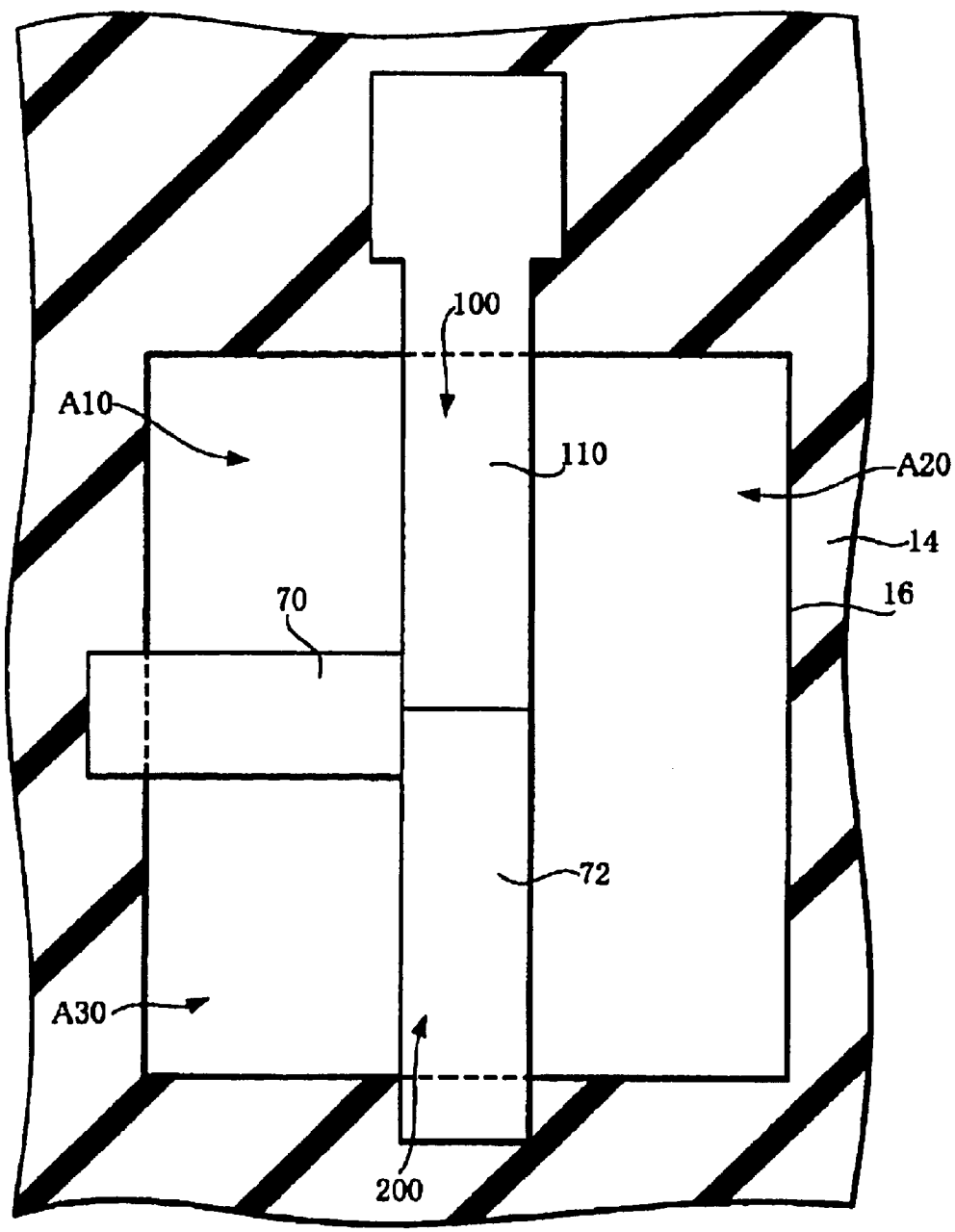
FIG. 27 schematically shows a plan view of a modified example of a semiconductor device in a layer in which the gate electrode layer is formed in accordance with an embodiment of the present invention.

(2) In the embodiment described above, the first gate electrode layer 110 is provided in a manner to cross over the element forming region 16. Also, the first electrode layer 60 is formed extending from the side section of the first gate electrode layer 110 and reaching the element isolation region 16. However, without being limited to this, the first region A10, the second region A20 and the third region A30 can be formed by the first gate electrode layer 110, the first layer 70 and the second layer 72, as shown in FIG. 27. The material for the first layer 70 and the second layer 72 are not particularly limited, and for example, a dielectric material (for example, silicon oxide, silicon nitride) may be used therefor.

In the modified example (2), the gate electrode layer 110, the first layer 70 and the second layer 72 may be connected, for example, in the following relations. a) An end section of the first layer 70 continues to the gate electrode layer 110, and an end section of the second layer 72 also continues to the gate electrode layer 110. b) An end section of the first layer 70 continues to the gate electrode layer 110, and an end section of the second layer 72 continues to an end section of the first layer 70. c) An end section of the second layer 72 continues to the gate electrode layer 110, and an end section of the first layer 70 continues to an end section of the second layer 72.

In addition, the modified example (2) can also be applied to the second switch element 1000B.

The present invention is not limited to the embodiments described above, and many modifications can be made without departing the scope of the subject matter of the present invention.

What is claimed:

1. A semiconductor device comprising:
an insulation layer;
a semiconductor layer formed on the insulation layer;
an element isolation region formed in the semiconductor layer; and
a first element forming region and a second element forming region defined by the element isolation region;
wherein the first element forming region includes both a first bi-polar transistor and a first field effect transistor;
the first bi-polar transistor includes a first emitter region of a first conduction type, a first base region of a second conduction type, and a first collector region of the first conduction type,
the first field effect transistor includes a first gate electrode layer, a source region of the first conduction type, and a drain region of the first conduction type,
the first field effect transistor further includes a first body region of the second conduction type formed at least between the source region of the first conduction type and the drain region of the first conduction type,
the first body region of the second conduction type is electrically connected to the source region of the first conduction type,
the first body region of the second conduction type is in contact with and thereby electrically connected to the first base region of the second conduction type,
the drain region of the first conduction type is electrically connected to the first collector region of the first conduction type, and
the source region of the first conduction type is formed structurally isolated from the first emitter region of the first conduction type, and
wherein the second element forming region includes both a second bi-polar transistor and a second field effect transistor,
the second bi-polar transistor includes a second emitter region of the first conduction type, a second base region of the second conduction type, and a second collector region of the first conduction type,
the second field effect transistor includes a second gate electrode layer, a source region of the second conduction type, and a drain region of the second conduction type,
the second field effect transistor further including a first body region of the first conduction type formed at least between the source region of the second conduction type and the drain region of the second conduction type,
the first body region of the first conduction type is electrically connected to the second collector region of the first conduction type,
the source region of the second conduction type is electrically connected to the second collector region of the first conduction type,
the drain region of the second conduction type is electrically connected to the second base region of the second conduction type,
the first collector region of the first conduction type is electrically connected to the second emitter region of the first conduction type, and
the first gate electrode layer is electrically connected to the second gate electrode layer.

2. A semiconductor device according to claim 1, wherein the first conduction type is n-type, and the second conduction type is p-type.

3. A semiconductor device according to claim 1, wherein the first conduction type is p-type, and the second conduction type is n-type.

4. A semiconductor device according to claim 1, wherein the semiconductor layer is a silicon layer.

5. A semiconductor device comprising:
an insulation layer;
a semiconductor layer formed on the insulation layer,
an element isolation region formed in the semiconductor layer, and
a first element forming region and a second element forming region defined by the element isolation region,
wherein the first clement forming region includes both a first bi-polar transistor and a first field effect transistor,
a first gate electrode layer is formed on the semiconductor layer,
the first gate electrode layer is formed in a manner to cross over the first element forming region,
a first electrode layer is formed on the semiconductor layer,
the first electrode layer has one end section continuing to a side section of the first gate electrode layer, and another end section reaching the element isolation region,
a first impurity diffusion layer of a first conduction type is formed at least in a part of a first region surrounded by the first gate electrode layer in a forming region of the first field effect transistor, the first electrode layer and the element isolation region, a second impurity diffusion layer of the first conduction type is formed in a second region surrounded by the first gate electrode layer and the element isolation region, a third impurity diffusion layer of the first conduction type is formed in a third region defined by the first gate electrode layer in a forming region of the first bi-polar transistor, the first electrode layer and the element isolation region, a first body region of a second conduction type is formed below the first gate electrode layer in a forming region of the first field effect transistor and the first electrode layer, a first impurity diffusion layer of the second conduction type is formed below the first gate electrode layer in the forming region of the first bi-polar transistor and the first electrode layer and along a periphery of the third impurity diffusion layer of the first conduction type, the first body region of the second conduction type is electrically connected to the first impurity diffusion layer of the first conduction type, and the first body region of the second conduction type is electrically connected to the first impurity diffusion layer of the second conduction type, wherein the second element forming region includes both a second bi-polar transistor and a second field effect transistor, a second gate electrode layer is formed on the semiconductor layer, the second gate electrode layer is formed in a manner to cross over the second element forming region, a second electrode layer is formed on the semiconductor layer, the second electrode layer has one end section continuing to a side section of the second gate electrode layer, and another end section reaching the element isolation region, a second impurity diffusion layer of the second conduction type is formed in a fourth region surrounded by the second gate electrode layer in a forming region of the second field effect transistor, the first electrode layer and the element isolation region, a third impurity diffusion layer of the second conduction type is formed in a fifth region surrounded by the second gate electrode layer and the element isolation region and in the forming region of the second field effect transistor, a fourth impurity diffusion layer of the first conduction type is formed in a fifth region in a forming region of the second bi-polar transistor, a fifth impurity diffusion layer of the first conduction type is formed in a sixth region surrounded by the second gate electrode layer in the forming region of the second bi-polar transistor and the element isolation region, a body region of the first conduction type is formed below the second gate electrode layer, a fourth impurity diffusion layer of the second conduction type is formed below the second gate electrode layer in the forming region of the second bi-polar transistor and the second electrode layer and along a periphery of the fifth impurity diffusion layer of the first conduction type, the body region of the first conduction type is electrically connected to the fourth impurity diffusion layer of the first conduction type, the third impurity diffusion layer of the second conduction type is electrically connected to the fourth impurity diffusion layer of the first conduction type, the second impurity diffusion layer of the second conduction type is electrically connected to the fourth impurity diffusion layer of the second conduction type, the second impurity diffusion layer of the first conduction type is electrically connected to the fifth impurity diffusion layer of the first conduction type, and the first gate electrode layer is electrically connected to the second gate electrode layer.

6. A semiconductor device comprising:

an insulation layer;

a semiconductor layer formed on the insulation layer;

an element isolation region formed in the semiconductor layer; and a first element forming region and a second element forming region defined by the element isolation region;

wherein the first element forming region includes both a first bi-polar transistor and a first field effect transistor;

the first bi-polar transistor includes a first emitter region of a first conduction type, a first base region of a second conduction type, and a first collector region of the first conduction type, the first field effect transistor includes a first gate electrode layer, a source region of the first conduction type, and a drain region of the first conduction type, the first field effect transistor further includes a first body region of the second conduction type formed at least between the source region of the first conduction type and the drain region of the first conduction type, the first body region of the second conduction type is electrically connected to the source region of the first conduction type, the first body region of the second conduction type is electrically connected to the first base region of the second conduction type, the drain region of the first conduction type is electrically connected to the first collector region of the first conduction type, and the source region of the first conduction type is formed structurally isolated from the first emitter region of the first conduction type, and wherein the second element forming region includes both a second bi-polar transistor and a second field effect transistor, the second bi-polar transistor includes a second emitter region of the first conduction type, a second base region of the second conduction type, and a second collector region of the first conduction type, the second field effect transistor includes a second gate electrode layer, a source region of the second conduction type, and a drain region of the second conduction type, the second field effect transistor further including a first body region of the first conduction type formed at least between the source region of the second conduction type and the drain region of the second conduction type, the first body region of the first conduction type is electrically connected to the second collector region of the first conduction type, the source region of the second conduction type is electrically connected to the second collector region of the first conduction type, the drain region of the second conduction type is electrically connected to the second base region of the second conduction type, the first collector region of the first conduction type is electrically connected to the second emitter region of the first conduction type, and the first gate electrode layer is electrically connected to the second gate electrode layer; and further comprising:

a first layer and a second layer that continues to a side section of the gate electrode layer and reaches the element isolation region, wherein the first gate electrode layer is formed in a manner to cross over the element forming region, the source region of the first conduction type is formed in a first region surrounded by the first gate electrode layer in a forming region of the first field effect transistor, the first electrode layer, and the element isolation region, the drain region of the first conduction type and the collector region of the first conduction type are formed in a second region surrounded by the first gate electrode layer and the element isolation region, the emitter region of the first conduction type is formed in a third region surrounded by the first gate electrode layer in a forming region of the first bi-polar transistor, the first electrode layer and the element isolation region, and the first body region of the second conduction type is formed at least below the first gate electrode layer in the forming region of the first field effect transistor, and below a part of the first electrode layer.

7. A semiconductor device according to claim 6, further comprising:

a second electrode layer having one end section that continues to a side section of the second gate electrode layer and another end section that reaches the element isolation region, wherein the second gate electrode layer is formed in a manner to cross over the second element forming region, the drain region of the second conduction type is formed in a fourth region surrounded by the second gate electrode layer in the forming region of the second field effect transistor, the second electrode layer, and the element isolation region, the source region of the second conduction type and the collector region of the first conduction type are formed in a fifth region surrounded by the second gate electrode layer and the element isolation region, the emitter region of the first conduction type is formed in a sixth region surrounded by the second gate electrode layer in the forming region of the second bi-polar transistor, the second electrode layer and the element isolation region, and the first body region of the first conduction type is formed below the second gate electrode layer.

8. A semiconductor device, comprising:

an insulation layer;

a semiconductor layer formed on the insulation layer, an element isolation region formed in the semiconductor layer, and a first element forming region and a second element forming region defined by the element isolation region;

wherein the first clement forming region includes both a first bi-polar transistor and a first field effect transistor;

the first bi-polar transistor includes a first emitter region or a first conduction type, a first base region of a second conduction type, and a first collector region of the first conduction type, the first field effect transistor includes a first gate electrode layer, a source region of the first conduction type, and a drain region of the first conduction type, the first field effect transistor further includes a first body region of the second conduction type formed at least between the source region of the first conduction type and the drain region of the first conduction type, the first body region of the second conduction type is electrically connected to the source region of the first conduction type.

the first body region of the second conduction type is electrically connected to the first base region of the second conduction type, the drain region of the first conduction type is electrically connected to the first collector region of the first conduction type, and the source region of the first conduction type is formed structurally isolated from the first emitter region of the first conduction type, and wherein the second element forming region includes both a second bi-polar transistor and a second field effect transistor, the second bi-polar transistor includes a second emitter region of the first conduction type, a second base region of the second conduction type, and a second collector region of the first conduction type, the second field effect transistor includes a second gate electrode layer, a source region of the second conduction type, and a drain region of the second conduction type, the second field effect transistor further including a first body region of the first conduction type formed at least between the source region of the second conduction type and the drain region of the second conduction type, the first body region of the first conduction type is electrically connected to the second collector region of the first conduction type, the source region of the second conduction type is electrically connected to the second collector region of the first conduction type, the drain region of the second conduction type is electrically connected to the second base region of the second conduction type, the first collector region of the first conduction type is electrically connected to the second emitter region of the first conduction type, and the first gate electrode layer is electrically connected to the second gate electrode layer; and further comprising:

a first layer and a second layer, wherein the first layer has one end section continuing to the first gate electrode layer or the second layer,and another end section reaching the element isolation region, the second layer has one section continuing to the first gate electrode layer or the second layer, and another end section reaching the element isolation region, the source region of the first conduction type is formed in a first region surrounded by the first gate electrode layer, the first layer and the element isolation region, the drain region of the first conduction type and the collector region of the first conduction type are formed in a second region surrounded by the first gate electrode layer, the second layer and the element isolation region, the first emitter region of the first conduction type is formed in a third region surrounded by the first gate layer, the second layer and layer and the element isolation region, the first base region of the second conduction type is formed below a part of the first layer, and below a part of the second layer in the semiconductor layer, and the first body region of the second conduction type is formed at least below the first gate electrode layer and below a part of the first layer in the semiconductor layer.

9. A semiconductor device according to claim 8, further comprising:

a third layer and a fourth layer, wherein the third layer has one end section continuing to the second gate electrode layer or the fourth layer, and another end section reaching the element isolation region, the fourth layer has one end section continuing to the second gate electrode layer or the third layer, and another end section reaching the element isolation region, the drain region of the second conduction type is formed in a fourth region surrounded by the second gate electrode layer, the third layer and the element isolation region, the source region of the second conduction type and the second collector region of the first conduction type are formed in a fifth region surrounded by the second gate electrode layer, the fourth layer and the element isolation region, the second emitter region of the first conduction type is formed in a sixth region surrounded by the third layer, the fourth layer and the element isolation region, the second base region of the second conduction type is formed below a part of the third layer and below a part of the fourth layer in the semiconductor layer, and the first body region of the first conduction type is formed at least below the second gate electrode layer and below a part of the fourth layer in the semiconductor layer, and a second body region of the second conduction type is provided in the semiconductor layer below a part of the third layer for electrically connecting the second body region of the second conduction type and the drain region of the second conduction type.

10. A semiconductor device comprising:

an insulation layer;

a semiconductor layer formed on the insulation layer;

an element isolation region formed in the semiconductor layer; and a first element forming region and a second element forming region defined by the element isolation region;

wherein the first element forming region includes both a first bi-polar transistor and a first field effect transistor;

the first bi-polar transistor includes a first emitter region of a first conduction type, a first base region of a second conduction type, and a first collector region of the first conduction type, the first field effect transistor includes a first gate electrode layer, a source region of the first conduction type, and a drain region of the first conduction type, the first field effect transistor further includes a first body region of the second conduction type formed at least between the source region of the first conduction type and the drain region of the first conduction type, the first body region of the second conduction type is electrically connected to the source region of the first conduction type, the first body region of the second conduction type is electrically connected to the first base region of the second conduction type, the drain region of the first conduction type is electrically connected to the first collector region of the first conduction type, and the source region of the first conduction type is formed structurally isolated from the first emitter region of the first conduction type, and wherein the second clement forming region includes both a second bi-polar transistor and a second field effect transistor, the second bi-polar transistor includes a second emitter region of the first conduction type, a second base region of the second conduction type, and a second collector region of the first conduction type, the second field effect transistor includes a second gate electrode layer, a source region of the second conduction type, and a drain region of the second conduction type, the second field effect transistor further including a first body region of the first conduction type formed at least between the source region of the second conduction type and the drain region of the second conduction type, the first body region of the first conduction type is electrically connected to the second collector region of the first conduction type, the source region of the second conduction type is electrically connected to the second collector region of the first conduction type, the drain region of the second conduction type is electrically connected to the second base region of the second conduction type, the first collector region of the first conduction type is electrically connected to the second emitter region of the first conduction type, and the first gate electrode layer is electrically connected to the second gate electrode layer, and further comprising, in a first element forming region, a second body region of a first conduction type, which is formed in a semiconductor layer between a first base region of a second conduction type and a first collector region of a first conduction type.

11. A semiconductor device comprising:

an insulation layer;

a semiconductor layer formed on the insulation layer;

an element isolation region formed in the semiconductor layer; and a first element forming region and a second element forming region defined by the element isolation region;

wherein the first element forming region includes both a first bi-polar transistor and a first field effect transistor;

the first bi-polar transistor includes a first emitter region of a first conduction type, a first base region of a second conduction type, and a first collector region of the first conduction type, the first field effect transistor includes a first gate electrode layer, a source region of the first conduction type, and a drain region of the first conduction type, the first field effect transistor further includes a first body region of the second conduction type formed at least between the source region of the first conduction type and the drain region of the first conduction type, the first body region of the second conduction type is electrically connected to the source region of the first conduction type, the first body region of the second conduction type is electrically connected to the first base region of the second conduction type, the drain region of the first conduction type is electrically connected to the first collector region of the first conduction type, and the source region of the first conduction type is formed structurally isolated from the first emitter region of the first conduction type, and wherein the second element forming region includes both a second bi-polar transistor and a second field effect transistor, the second bi-polar transistor includes a second emitter region of the first conduction type, a second base region of the second conduction type, and a second collector region of the first conduction type, the second field effect transistor includes a second gate electrode layer, a source region of the second conduction type, and a drain region of the second conduction type the second field effect transistor further including a first body region of the first conduction type formed at least between the source region of the second conduction type and the drain region of the second conduction type, the first body region of the first conduction type is electrically connected to the second collector region of the first conduction type, the source region of the second conduction type is electrically connected to the second collector region of the first conduction type, the drain region of the second conduction type is electrically connected to the second base region of the second conduction type, the first collector region of the first conduction type is electrically connected to the second emitter region of the first conduction type, and the first gate electrode layer is electrically connected to the second gate electrode layer;

wherein an impurity diffusion layer of the second conduction type is further fanned in the first element forming region, wherein the impurity diffusion layer of the second conduction type is a semiconductor layer in the first region, and is formed in the semiconductor layer between the source region of the first conduction type and the first body region of the second conduction type, and the source region of the first conduction type and the first body region of the second conduction type are electrically connected to one another through the impurity diffusion layer of the second conduction type.

12. A semiconductor device according to claim 11, wherein a contact layer for electrically connecting the impurity diffusion layer of the second conduction type and the source region of the first conduction type is formed, wherein the contact layer is formed in a manner to cross over the impurity diffusion layer of the second conduction type and the source region of the first conduction type.

13. A semiconductor device according to claim 12, wherein a contact layer for electrically connecting the source region of the second conduction type and the second contact region of the first conduction type is formed in the second element isolation region, wherein the contact layer is formed in a manner to cross over the source region of the second conduction type and the second collector region of the first conduction type.

14. A semiconductor device comprising:

an insulation layer;

a semiconductor layer formed on the insulation layer;

an element isolation region formed in the semiconductor layer; and a first element forming region and a second element forming region defined by the element isolation region;

wherein the first element forming region includes both a first bi-polar transistor and a first field effect transistor;

the first bi-polar transistor includes a first emitter region of a first conduction type, a first base region of a second conduction type, and a first collector region of the first conduction type, the first field effect transistor includes a first gate electrode layer, a source region of the first conduction type, and a drain region of the first conduction type, the first field effect transistor further includes a first body region of the second conduction type formed at least between the source region of the first conduction type and the drain region of the first conduction type, the first body region of the second conduction type is electrically connected to the source region of the first conduction type, the first body region of the second conduction type is electrically connected to the first base region of the second conduction type, the drain region of the first conduction type is electrically connected to the first collector region of the first conduction type, and the source region of the first conduction type is formed structurally isolated from the first emitter region of the first conduction type, and wherein the second element forming region includes both a second bi-polar transistor and a second field effect transistor, the second bi-polar transistor includes a second emitter region of the first conduction type, a second base region of the second conduction type, and a second collector region of the first conduction type, the second field effect transistor includes a second gate electrode layer, a source region of the second conduction type, and a drain region of the second conduction type, the second field effect transistor further including a first body region of the first conduction type formed at least between the source region of the second conduction type and the drain region of the second conduction type, the first body region of the first conduction type is electrically connected to the second collector region of the first conduction type, the source region of the second conduction type is electrically connected to the second collector region of the first conduction type, the drain region of the second conduction type is electrically connected to the second base region of the second conduction type, the first collector region of the first conduction type is electrically connected to the second emitter region of the first conduction type, and the first gate electrode layer is electrically connected to the second gate electrode layer; and wherein a third body region of the second conduction type is formed in the semiconductor layer between the first collector region of the first conduction type and the first emitter region of the first conduction type and in the semiconductor layer adjacent to the clement isolation region.

15. A semiconductor device according to claim 14, wherein a fourth body region of the second conduction type is formed in the semiconductor layer between the second collector region of the first conduction type and the second emitter region of the first conduction type, and in the semiconductor layer adjacent to the element isolation region.

* * * * *